United States Patent
Tran et al.

(10) Patent No.: US 7,350,130 B2
(45) Date of Patent: Mar. 25, 2008

(54) **DECODING LDPC (LOW DENSITY PARITY CHECK) CODE WITH NEW OPERATORS BASED ON MIN\* OPERATOR**

(75) Inventors: Hau Thien Tran, Irvine, CA (US); Ba-Zhong Shen, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 561 days.

(21) Appl. No.: 11/017,403

(22) Filed: Dec. 20, 2004

(65) Prior Publication Data

US 2005/0149844 A1 Jul. 7, 2005

Related U.S. Application Data

(63) Continuation-in-part of application No. 10/347,732, filed on Jan. 21, 2003.

(60) Provisional application No. 60/535,484, filed on Jan. 10, 2004, provisional application No. 60/403,847, filed on Aug. 15, 2002, provisional application No. 60/427,979, filed on Nov. 20, 2002.

(51) Int. Cl.
*H03M 13/00* (2006.01)
(52) U.S. Cl. ............... 714/758; 714/804; 714/801
(58) Field of Classification Search ............... 714/804, 714/801
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 * | 10/2003 | Richardson et al. | 706/15 |
| 6,725,409 B1 * | 4/2004 | Wolf | 714/755 |
| 6,789,227 B2 * | 9/2004 | De Souza et al. | 714/804 |
| 6,895,547 B2 * | 5/2005 | Eleftheriou et al. | 714/801 |
| 7,116,732 B2 * | 10/2006 | Worm et al. | 375/341 |
| 7,209,527 B2 * | 4/2007 | Smith et al. | 375/341 |

(Continued)

OTHER PUBLICATIONS

Anastasopoulos, Achilleas, A Comparison Between the Sum-Product and the Min-Sum Iterative Detection Algorithms based on Density Evolution, 2001, IEEE, pp. 1021-1025.*

(Continued)

*Primary Examiner*—Mujtaba K. Chaudry
(74) *Attorney, Agent, or Firm*—Garlick Harrison & Markison; Shayne X. Short

(57) ABSTRACT

Decoding LDPC (Low Density Parity Check) code with new operators based on min\* operator. New approximate operators are provided that may be employed to assist in calculating one or a minimum value (or a maximum value) when decoding various coded signals. In the context of LDPC decoding that involves both bit node processing and check node processing, either of these new operators (i.e., the min† (min-dagger) operator or the min' (min-prime) operator) may be employed to perform the check node processing that involves updating the edge messages with respect to the check nodes. Either of these new operators, min† operator or min' operator, is shown herein to be a better approximate operator to the min\*\* operator.

20 Claims, 9 Drawing Sheets

U.S. PATENT DOCUMENTS

2002/0051501 A1* 5/2002 Demjaneko et al. ........ 375/298
2003/0104788 A1 6/2003 Kim

OTHER PUBLICATIONS

Al-Rawi et. al., Optimizing the Mapping of Low-Density Parity-Check Codes on Parallel Decoding Architectures, 2001, IEEE, pp. 578-586.*

Zarkeshvari et. al., On Implementation of Min-Sum Algorithm for Decoding Low-Density Parity-Check Codes, 2002, IEEE, pp. 1349-1353.*

R. Gallager, Low-Density Parity-Check Codes, Cambridge, MA: MIT Press, 1963.

M. Luby, M. Mitzenmacher, A. Shokrollahi, D. Spielman, and V. Stemann, "Practical loss-resilient codes," 1997.

T. J. Richardson and R. L. Urbanke, "The capacity of low-density parity-check code under message-passing decoding," IEEE Trans. Inform. Theory, vol. 47, pp. 599-618, Feb. 2001.

E. Eleftheriou and S. Olcer, "Low-Density Parity-Check Codes for Digital Subscriber Lines," 0-7803-7400-Feb. 2002, IEEE, 2002, pp. 1752-1757.

Draft ETSI EN 302 307 V1.1.1 (Jun. 2004), Digital Video Broadcasting (DVB); Second generation framing structure, channel coding and modulation systems for Broadcasting, Interactive Services, News Gathering and other broadband satellite applications.

J. Hagenauer, E. Offer and L. Papke, "Interative decoding of binary block and convolutional codes," IEEE Trans. Inform. Theory, vol. 42, No. 2 Mar. 1996, pp. 429-445.

E. Eleftheriou, T. Mittelholzer and A. Dholakia, "Reduced-complexity decoding algorithm for low-density parity-check codes," IEE Electronic Letters, vol. 37, pp. 102-104, Jan. 2001.

* cited by examiner

US 7,350,130 B2

DECODING LDPC (LOW DENSITY PARITY CHECK) CODE WITH NEW OPERATORS BASED ON MIN* OPERATOR

CROSS REFERENCE TO RELATED PATENTS/PATENT APPLICATIONS

Provisional priority claim

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:
  1. U.S. Provisional Application Ser. No. 60/535,484, "Decoding LDPC (Low Density Parity Check) code with new operators based on min* operator," filed Jan. 10, 2004, pending.

CIP of BP2541

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:
  1. U.S. Utility Patent Application Ser. No. 10/347,732, entitled "Inverse function of min*: min*- (inverse function of max*: max*-)," filed Jan. 21, 2003, pending, which claims priority pursuant to 35 U.S.C. § 119(e) to the following U.S. Provisional Patent Applications which are hereby incorporated herein by reference in their entirety and made part of the present U.S. Utility Patent Application for all purposes:
    a. U.S. Provisional Application Ser. No. 60/403,847, entitled "Inverse of min*: min*- (the inverse of max*: max*-)," filed Aug. 15, 2002.
    b. U.S. Provisional Application Ser. No. 60/427,979, "Single stage implementation of min*, max*, min and/or max to perform state metric calculation in SISO decoder," filed Nov. 20, 2002.

BACKGROUND OF THE INVENTION

1. Technical Field of the Invention

The invention relates generally to communication systems; and, more particularly, it relates to decoders within communication systems that are employed to decode signals that have been coded using Low Density Parity Check (LDPC) code, turbo code, TTCM (Turbo Trellis Coded Modulation), or some other type of code.

2. Description of Related Art

Data communication systems have been under continual development for many years. One such type of communication system that has been of significant interest lately is a communication system that employs turbo codes. Another type of communication system that has also received interest is a communication system that employs Low Density Parity Check (LDPC) code. LDPC codes are oftentimes referred to in a variety of ways. For example, iterative soft decoding of LDPC codes may be implemented in a number of ways including based on the Belief Propagation (BP) algorithm, the Sum-Product (SP) algorithm, and/or the Message-Passing (MP) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a device to complete such decoding. For example, there are a variety of relatively complex and numerically burdensome calculations, data management and processing that must be performed to effectuate the accurate decoding of an LDPC coded signal.

A primary directive in these areas of development has been to try continually to lower the error floor within a communication system. The ideal goal has been to try to reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB from the theoretical Shannon limit. While this example was achieved using an irregular LDPC code of a length of one million, it nevertheless demonstrates the very promising application of LDPC codes within communication systems.

In performing calculations when decoding a received signal, it is common for decoders to operate in the natural log (ln) domain; LDPC decoders also fall in to this category. By operating within the natural log domain, this converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a+e^b+e^c+\ldots)$$

This calculation can be significantly reduced in complexity using the Jacobian formula shown below:

$$\max^*(a,b)=\ln(e^a+e^b)=\max(a,b)+\ln(1+e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a+e^b+e^c)$, the following two max* operations may be performed:

$$\max^*(a,b)==\ln(e^a+e^b)=\max(a,b)+\ln(1+e^{-|a-b|})=x$$

$$\max^*(a,b,c)=\max^*(x,c)=\ln(e^x+e^c)=\max(x,c)+\ln(1+e^{-|x-c|})$$

While there has a been a great deal of development within the context of LDPC code, the extensive processing and computations required to perform decoding therein can be extremely burdensome—this one example above of the calculating the sum of exponentials illustrates the potentially complex and burdensome calculations needed when performing decoding. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1+e^{-|a-b|})$ altogether and use only the max(a, b) result which may be implemented within a single instruction within a digital signal processor (DSP). However, this will inherently introduce some degradation in decoder performance. Most of the common approaches that seek to provide some computational improvements either cut corners in terms of computational accuracy, or they do not provide a sufficient reduction in computational complexity to justify their integration. One of the prohibiting factors concerning the implementation of many LDPC codes is oftentimes the inherent computational complexity coupled with the significant amount of memory required therein.

There still exists a need in the art to provide for more efficient solutions when making calculations, such as max*, within decoders that operate within the logarithmic domain.

The use of LDPC coded signals continues to be explored within many newer application areas. One such application area is that digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the following Internet address:

"http://www.dvb.org/"

The DVB-S2 (i.e., DVB-Satellite Version 2) draft standard is also publicly available via this Internet address, and the current DVB-S2 draft standard may be downloaded in Adobe PDF format at the following Internet address:

"http://www.dvb.org/documents//
en302307.v1.1.1.draft.pdf"

The entire contents of this current DVB-S2 draft standard, "Draft ETSI EN 302 307 V1.1.1 (2004-06), Digital Video Broadcasting (DVB); Second generation framing structure, channel coding and modulation systems for Broadcasting, Interactive Services, News Gathering and other broadband satellite applications" is hereby incorporated herein by reference in its entirety and made part of the present disclosure for all purposes.

Greater detail regarding the types of signals employed within such DVB-S2 compliant systems is included within this current DVB-S2 draft standard. The current DVB-S2 draft standard focuses primarily on the transmission system description and the subsystems therein including mode adaptation, stream adaptation, FEC encoding (including both BCH outer encoding and LDPC inner encoding), bit mapping into constellation, physical layer framing, and baseband shaping and quadrature modulation.

The DVB-S2 is an advanced version of DVB-S (the first standard produced by the Digital Video Broadcasting Project). DVB-S2 seeks to provide for greater efficiency than DVB-S. DVB-S2 plans to implement 4 different modulation types: QPSK (Quadrature Phase Shift Key), 8 PSK (Phase Shift Key), 16 APSK (Asymmetric Phase Shift Keying), and 32 APSK. Generally speaking, the QPSK and 8 PSK modulation types are intended for broadcast applications through non-linear satellite transponders driven near to saturation; the 16 APSK and 32 APSK modulation types are geared more primarily towards professional applications requiring semi-linear transponders. The 16 APSK and 32 APSK modulation types operate by trading off power efficiency for greater throughput.

In addition, DVB-S2 uses a powerful FEC (Forward Error Correction) system based on concatenation of BCH (Bose-Chaudhuri-Hocquenghem) outer coding with LDPC inner coding. The result is performance which is at times only 0.7 dB from the Shannon limit. The choice of FEC parameters depends on the system requirements. With VCM (Variable Coding and Modulation) and ACM (Adaptive Coding and Modulation), the code rates can be changed dynamically, on a frame by frame basis.

The multiple operational parameters to which a receiving device, that includes a decoder, must operate to be DVB-S2 compliant is very clearly laid out by the operational parameters of the transmission system description. However, as long as a receiving device, that includes a decoder, complies with these operational parameters specified within the current DVB-S2 draft standard, great latitude in the means of implementation is permissible. The generation of signals on the transmission end of a communication channel is clearly laid out within the current DVB-S2 draft standard, and the means by which the receive processing of such signal (at the receiving end of a communication channel) may be performed is widely open to the designer. Clearly, a key design constrain of such receiving devices is to provide for the accommodation of such DVB-S2 signals while providing for very high performance while occupying a relatively small amount of area and having a relatively lower level of complexity.

Another application area in which the use of LDPC coded signals continues to be explored is in various communication system embodiments and application areas whose operation is specified and governed by the IEEE (Institute of Electrical & Electronics Engineers). For example, the use of LDPC coded signals has been of significant concern within the IEEE P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Typical encoding and modulation of LDPC coded signals is performed by generating a signal that includes symbols each having a common code rate and being mapped to a singular modulation (e.g., a singular constellation shape having a singular mapping of the constellation points included therein). That is to say, all of the symbols of such an LDPC coded modulation signal have the same code rate and the same modulation (the same constellation shape whose constellation points have the singular mapping). Oftentimes, such prior art designs are implemented as to maximize the hardware and processing efficiencies of the particular design employed to generate the LDPC coded signal having the single code rate and single modulation for all of the symbols generated therein.

However, in some more recent prior art LDPC communication systems, the design of LDPC encoders has sought to provide for capabilities to generate multiple types of LDPC coded signals. Within these communication systems, the code rate and modulation type for all of the symbols within any given LDPC block is the same. That is to say, the entire block has a particular code rate and modulation type associated with it. Nevertheless, the encoder is operable to generate different LDPC blocks such that a first LDPC block has a first code rate and first modulation type associated with it, and a second LDPC block has a second code rate and second modulation type associated with it.

A decoder that operates to decode such signals must be able to accommodate the various LDPC block types that it may receive. Currently, the LDPC decoder designs being discussed in the art require a relatively large amount of area and are of a relatively high complexity. There is a need in the art to provide for an LDPC decoder that can accommodate such signals while providing for very high performance, less area, and less complexity.

BRIEF SUMMARY OF THE INVENTION

Various aspects of the invention can be found in a decoder that is operable to decode an LDPC (Low Density Parity Check) coded signal. The decoder includes a bit node processor and a check node processor. In some instances, the decoder also includes a metric generator, a symbol node calculator functional block, a hard limiter, and a syndrome calculation functional block.

The bit node processor is operable to receive a plurality of bit metrics and to perform bit node processing that involves updating a plurality of edge messages with respect to a plurality of bit nodes. The check node processor is operable to perform check node processing that involves updating a plurality of edge messages with respect to a plurality of check nodes by performing min† (min-dagger) processing or min' (min-prime processing). In embodiments that include the metric generator, the metric generator is operable to receive I, Q (In-phase, Quadrature) values corresponding to a symbol of the LDPC coded signal and to generate a plurality of symbol metrics from the I, Q values. In embodiments that include the symbol node calculator functional block, the symbol node calculator functional block is operable to generate the plurality of bit metrics from the plurality of symbol metrics. The hard limiter may be implemented and operable to receive soft output from the bit node processor that corresponds to most recently updated plurality of edge messages with respect to the plurality of bit nodes and to make best estimates of bits of a symbol of the LDPC coded signal using the soft output. The syndrome calculation functional block may be implemented to receive the best estimates of bits of the symbol of the LDPC coded signal from the hard limiter and is operable to determine whether each of a plurality of syndromes of an LDPC code by which the LDPC coded signal is generated is substantially equal to zero within a degree of precision.

In some embodiments, the check node processor further includes a min† functional block that is operable to perform min† processing on a plurality of inputs to generate a min† result. The min† functional block also includes a min* (min-star) functional block that performs min* processing on the plurality of inputs to generate a min* result. When the min* result is greater than or equal to zero within a predetermined degree of precision, the min† functional block outputs the min* result as the min† result, and when the min* result is less than zero within a predetermined degree of precision, the min† functional block outputs a value of zero as the min† result.

In some embodiments, the check node processor further includes a min' functional block that is operable to perform min' processing on a plurality of inputs thereby to generate a min' result. The min' functional block also includes a min functional block that performs min processing on the plurality of inputs to generate a min result. The min' functional block also includes a min* (min-star) functional block that is operable to perform min* processing on the plurality of inputs to generate a min* result. When the min result is greater than zero within a predetermined degree of precision, the min' functional block is operable to output the min* result as the min' result. When the min result is less than or equal to zero within the predetermined degree of precision, the min' functional block is operable to output a value of zero as the min' result.

The types of LDPC coded signals on which the decoder may operate may be varied. For example, the code rate and/or modulation may vary as frequently as on a frame by frame basis or even as frequently as on a symbol by symbol basis. Looking at some examples, the LDPC coded signal may be a variable code rate signal such that the first symbol of the LDPC coded signal has a first code rate, and the second symbol of the LDPC coded signal has a second code rate. Alternatively or in addition to the variable code rate characteristics of the LDPC coded signal, the LDPC coded signal may be a variable modulation signal such that the first symbol of the LDPC coded signal has a first modulation having a first constellation shape and a corresponding first mapping, and the second symbol of the LDPC coded signal has a second modulation having a second constellation shape and a corresponding second mapping.

It is also noted that the decoder is operable to decode LDPC coded signals that are compliant with at least one of DVB-S2 (Digital Video Broadcasting Project—Satellite Version 2) draft standard and recommended practices provided by IEEE (Institute of Electrical & Electronics Engineers) P802.3an (10GBASE-T) Task Force.

The invention envisions any type of communication device that supports the functionality and/or processing described herein. Moreover, various types of methods may be performed to support the functionality described herein without departing from the scope and spirit of the invention as well.

DETAILED DESCRIPTION OF THE INVENTION

Within various types of communication systems, decoding processing of received signals can often involve very complex calculations due to the very nature of the coding types involved (e.g., LDPC (Low Density Parity Check), turbo code, TTCM (Turbo Trellis Coded Modulation), among other coding types). Because of this complexity, the decoding processing within many of these decoders is oftentimes performed in the logarithmic domain where multiplications may be executed as additions and divisions may be executed as subtractions.

Some possible embodiments by which a decoder may be implemented are depicted herein. In performing this decoding processing, there is often a means by which a minimum (or maximum) of two values is to be determined along with some logarithmic correction factor. The log correction factor arises because the calculations are implemented in the logarithmic domain, in that, multiplications may be reduced to additions and divisions may be reduced to subtractions. In doing these calculations, many attempts are made to perform such calculations quicker and easier (e.g., making certain approximations). However, some of the approaches that have been made do not provide very good performance. There seems always to be room in the art for improvements by which such calculations and/or approximations may be made while providing for improved performance.

Various aspects of the invention involve presenting two new operators, whose operation may be implemented within corresponding functional blocks to perform calculations within decoders that perform calculations within the logarithmic domain (e.g., where multiplications can be implemented as additions and divisions can be implemented as subtractions). These calculations may be implemented to perform calculations within a variety of decoders including LDPC decoders, turbo decoders, TTCM decoders, and/or other decoder types without departing from the scope and spirit of the invention.

Figure 1:
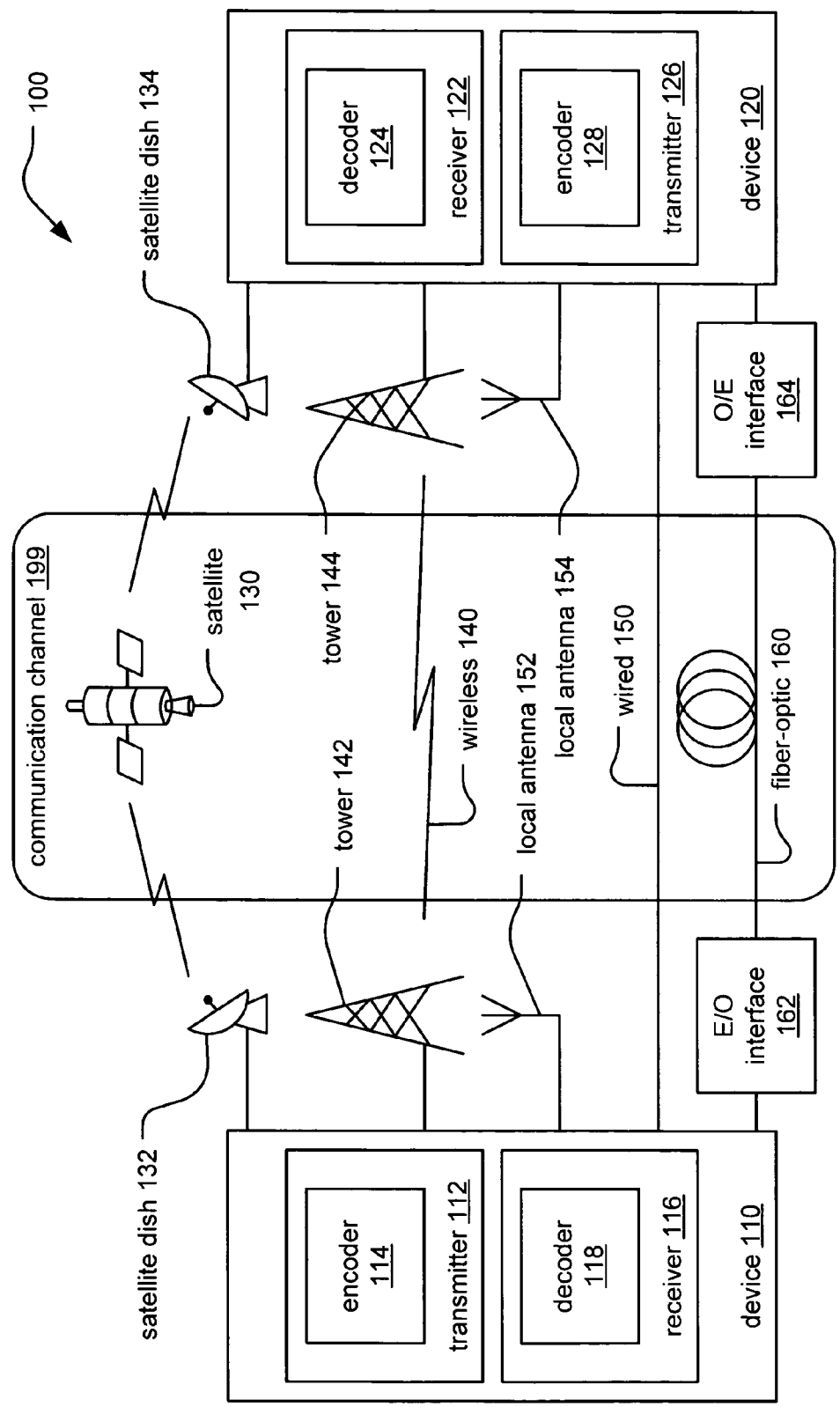
FIG. 1 and FIG. 2 are diagrams illustrating various embodiments of communication systems that may be built in accordance with certain aspects of the invention.
Figure 2:
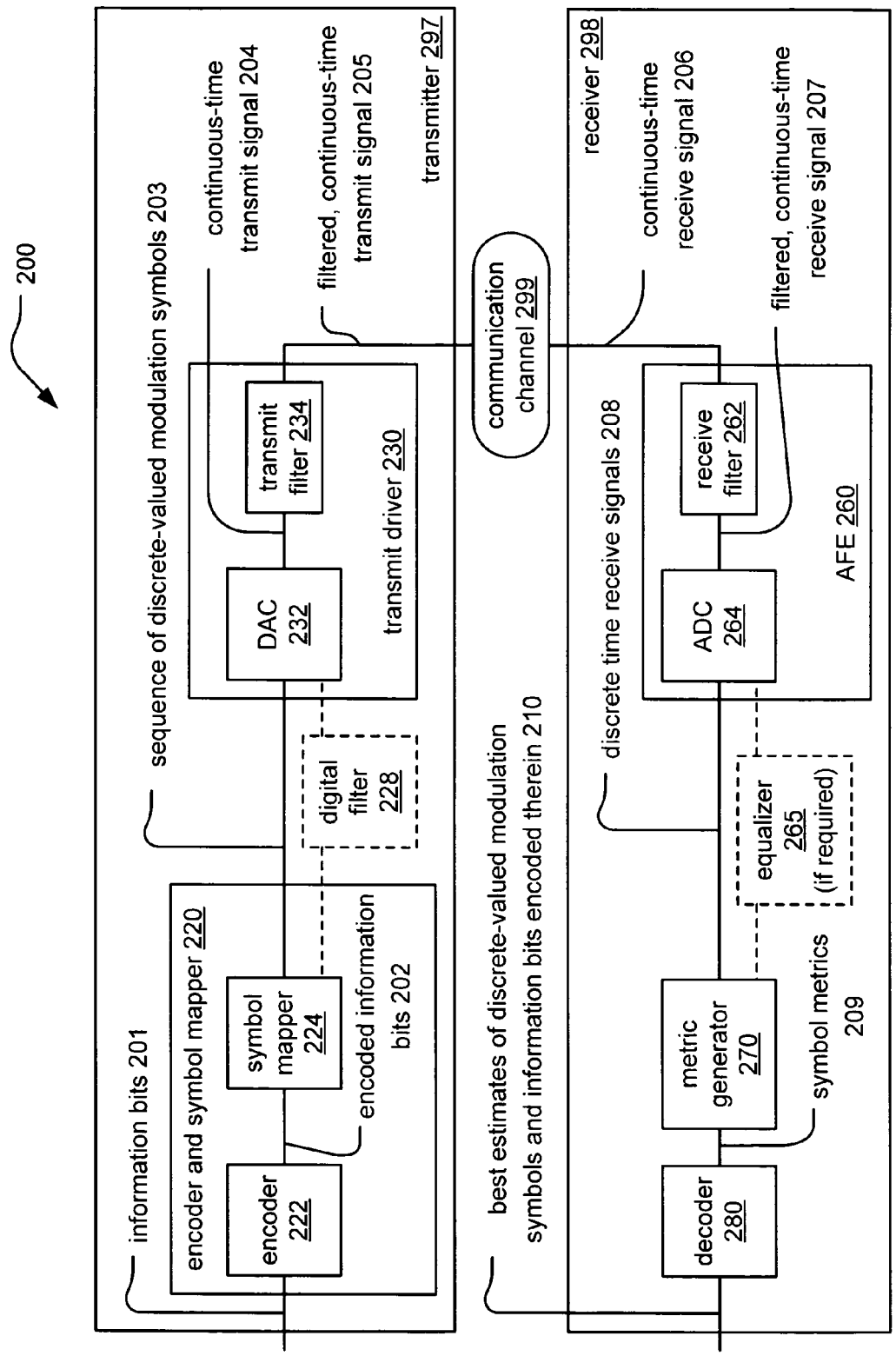

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 situated at one end of the communication channel 199 to another communication device 120 at the other end of the communication channel 199. There are several different types of media by which the communication channel 199 may be implemented. In addition, more than one type of media may be implemented and interfaced together thereby forming the communication channel 199.

As one example, the communication channel 199 may be implemented as a satellite communication channel in which signals are transmitted between the communication device 10 and the communication device 120 via one or more communication links to one or more satellites (a satellite 130 is shown). In such an embodiment, a transmitter 112 within the communication device 110 would be communicatively coupled to a satellite dish 132 that is operable to communicate with a satellite 130. The transmitter 112 may also be communicatively coupled to a wired network. This wired network may include any number of networks including the Internet, proprietary networks, other wired networks, and/or WANs (Wide Area Networks). The transmitter 112 employs the satellite dish 132 to communicate to the satellite 130 via a wireless communication channel. The satellite 130 is able to communicate with a receiver 122 within the communication device 120 (via a corresponding satellite dish 134 communicatively coupled to the communication device 120).

Here, the communication to and from the satellite 130 may cooperatively be viewed as being a wireless communication channel; or each of the communication links to and from the satellite 130 may be viewed as being two distinct wireless communication channels.

For example, the wireless communication "channel" may be viewed as not including multiple wireless hops in one embodiment. In other multi-hop embodiments, the satellite 130 receives a signal from the transmitter 112 (via the satellite dish 132), amplifies it, and relays it to the receiver 122 (via the satellite dish 134); the receiver 122 may also be implemented using terrestrial receivers such as satellite receivers, satellite based telephones, and/or satellite based Internet receivers, among other receiver types. In the case where the satellite 130 receives a signal from the transmitter 112 (via the satellite dish 132), amplifies it, and relays it, the satellite 130 may be viewed as being a "transponder;" this is a multi-hop embodiment. In addition, other satellites may exist that perform both receiver and transmitter operations in cooperation with the satellite 130. In this case, each leg of an up-down transmission via the wireless communication channel would be considered separately. In whichever embodiment, the satellite 130 is operable to establish a communication channel between the transmitter 112 and the receiver 122.

There are a wide variety of satellite communication systems that may be implemented including satellite television broadcast communication systems, HDTV (High Definition Television) broadcast communication systems, as well as satellite data communication systems (e.g., satellite Internet servicing).

In addition, the communication channel 199 may be implemented generally as any type of wireless communication channel 140. There are a variety of types of communication systems in which the wireless communication channel 140 may be implemented, including: cellular communication systems, microwave communication systems, point-to-point radio communication systems, WLAN (Wireless Local Area Network) communication systems, among other wireless communication system types. Generally speaking, the appropriate interface is implemented within the communication device 110 or the communication device 120 to facilitate operation within the particular type of wireless communication channel 140 of a particular embodiment. The communication device 110 may include a tower 142 and the communication device 120 may include a tower 144 to support communication within a microwave communication system.

The communication device 110 may include a local antenna 152, and the communication device 120 may include a local antenna 154; in both cases this will support communication within a point-to-point radio communication system. It is also noted that either of the local antenna 152 or the local antenna 154 may be implemented as a spatially diverse antenna arrangement that includes multiple antennae as well. Such radio front-ends are sometimes referred to as Multiple-Input/Multiple-Output (MIMO) communication devices.

In a cellular communication system, the communication device 110 may be implemented as a base station and employ a tower 142. This base station embodiment of the communication device 110 may be operable to communicate with the communication device 120 when it is implemented as a mobile station (or mobile unit) using a local antenna 154. There are a very wide variety of types of wireless communication systems in which the communication device 110 and the communication device 120 may be implemented. These types of wireless communication systems are shown generally as being supported by the wireless communication channel 140 between the communication device 110 and the communication device 120.

In addition, the communication channel 199 may be implemented generally as any type of wired communication channel 150. Such a wired communication channel 150 may be as focused and well-defined as being a trace connecting two or more integrated circuits on a printed circuit board. Alternatively, such a wired communication channel 150 may be as broad as including each wiring, cabling, interface and every wired segment between communication devices located significant distances from one another. In yet another embodiment, a wired communication channel 150 may be viewed as being the backplane interface between various boards within a larger device such as a server. There are a variety of types of wired communication systems in which the communication device 110 and the communication device 120 may be implemented including communication systems that are serviced by cable media providers (including cable television systems and cable modem/Internet servicing). The wired communication system may alternatively be a DSL (Digital Subscriber Line) communication system, an Ethernet communication system, or a data center communication system, among other types of communication systems employing a wired communication channel 150.

In yet another embodiment, the communication channel 199 may be implemented as a fiber-optic communication channel 160. In such an embodiment, the communication device 110 would interface with the fiber-optic communication channel 160 via an electrical to optical (E/O) interface 162, and the communication device 120 would interface with the fiber-optic communication channel 160 via an optical to electrical (O/E) interface 164.

It is also noted that the communication channel 199 that communicatively couples the communication device 110 and the communication device 120 may also be implemented as a combination of any number of types of communication channels. For example, a first portion of the communication channel 199 may be implemented as a wired communication channel, and a second portion of the communication channel 199 may be implemented as a wireless communication channel. Another portion of the communication channel 199 may be alternatively implemented as a fiber-optic communication channel. There are a myriad of possible combinations of types of communication channels that may be implemented to interconnect the communication device 110 and the communication device 120.

In whichever type of communication system 100 the communication device 110 and the communication device 120 are implemented, and using whichever type of communication channel 199 desired within a particular embodiment, the transmitter of the communication device 110 is operable to encode information (using an encoder 114) in a manner in accordance with the functionality and/or processing of at least some of the various aspects of the invention to assist in generating a signal that is to be launched into the communication channel 199 via the appropriate interface. The receiver 122 of the communication device 120 is operable to decode a signal (using a decoder 124) received from the communication channel in a manner in accordance with the functionality and/or processing of at least some of the various aspects of the invention.

Generally speaking, at a transmitting end of the communication channel 199, information bits are encoded and appropriately modulated into a format that comports with the type of communication channel across which the signal is to be transmitted. This may also include performing any appropriate filtering and/or frequency-conversion (e.g., usually up-converting) that is necessary to get the signal into a format that comports with the particular type of communication channel across which the signal is to be transmitted.

At a receiving end of the communication channel 199, the received signal is appropriately processed and demodulated from the format that comports with the communication channel 199 so that appropriate decoding may be performed to make best estimates of the information bits that have been encoded at the transmitting end of the communication channel. At the receiving end, this may also include performing any appropriate filtering and/or frequency-conversion (e.g., usually down-converting) that is necessary to get the signal from the format that comports with the particular type of communication channel into a format that can be processed at the receiving end of the communication channel 199.

It is also noted that communication between the communication device 110 and the communication device 120, in each of these various embodiments of communication systems, may support uni-directional or bi-directional communication functionality. In a bi-directional communication system, each of the communication device 110 and the communication device 120 may include a corresponding transmitter (112 and 126, respectively) including an encoder (114 and 128, respectively). Moreover, each of the communication device 110 and the communication device 120 may include a corresponding receiver (116 and 122, respectively) including a decoder (118 and 124, respectively).

However, alternative embodiments envision a communication system 100 including devices that support only uni-directional communication as well without departing from the scope and spirit of the invention. In a uni-directional communication system, the communication device 110 may be implemented as only including the transmitter 112 (as well as the encoder 114) at one end of the communication channel 199, and the communication device 120 may be implemented as only including the receiver 122 (as well as the decoder 124) at one end of the communication channel 199.

Referring to the communication system 200 of FIG. 2, at a transmitting end of a communication channel 299, information bits 201 are provided to a transmitter 297 that is operable perform appropriate encoding before launching an appropriately filtered, continuous-time transmit signal 205 into the communication channel 299. After the filtered, continuous-time transmit signal 205 has been launched into the communication channel 299 from the transmitter 297, the filtered, continuous-time transmit signal 205 is communicated from the transmitter 297 to a receiver 298 at the other end of the communication channel 299. The communication channel 299 may operate to introduce some deleterious effects to the filtered, continuous-time transmit signal 205 including a certain degree of noise having a particular PSD (Power Spectral Density), ISI (Inter-Symbol Interference), undesirable channel filtering effects, frequency spreading effects, and/or attenuation effects, among other types of undesirable effects that may be caused by the communication channel 299.

Within the transmitter 297, encoding of these information bits 201 is performed using an encoder and symbol mapper 220. The encoder and symbol mapper 220 may be viewed in more detail as including an encoder 222 and a symbol mapper 224.

This encoder and symbol mapper 220 may be implemented to support uncoded modulation, LDPC (Low Density Parity Check) encoding and modulation, TCM (Trellis Coded Modulation), turbo coding and modulation, TTCM (Turbo Trellis Coded Modulation), or LDPC (Low Density Parity Check) encoding and modulation, among other types of encoding and modulation, as well as any other types of encodings and modulations that operate to counter the effects of lowered SNR (Signal to Noise Ratio) and potentially introduced ISI (Inter-Symbol Interference) that may occur with a filtered, continuous-time transmit signal 205 as it is transmitted across a communication channel 299.

After the information bits 201 have been appropriately encoded using whichever encoding means is employed within a particular embodiment, the encoded information bits 202 may be grouped to form symbols (and/or codewords) that may be symbol mapped according to any number of different types of modulations (where each modulation includes a constellation shape and unique corresponding mapping of the constellation points included therein).

After the information bits 201 have been appropriately encoded (using the encoder 222) and symbol mapped (using the symbol mapper 224), a sequence of discrete-valued modulation symbols 203 is output from within the encoder and symbol mapper 220. This sequence of discrete-valued modulation symbols 203 is sometimes viewed as being a digital baseband signal. Sometimes, this digital baseband signal is separated into each of the I, Q (In-phase, Quadrature) components for each symbol within the sequence of discrete-valued modulation symbols 203.

Within the transmitter 297 shown in this embodiment, the sequence of discrete-valued modulation symbols 203 may also be viewed as being discrete-time transmit signals. This sequence of discrete-valued modulation symbols 203 (or the discrete-time transmit signals) are then provided to a transmit driver 230 that is operable to comport the sequence of discrete-valued modulation symbols 203 into an appropriate signal that may be launched into the communication channel 299.

The transmit driver 230 includes a DAC (Digital to Analog Converter) 232 that operates by inserting the sequence of discrete-valued modulation symbols 203 (or the discrete-time transmit signals) at a selected modulation rate thereby generating a continuous-time transmit signal 204. The resulting continuous-time transmit signal 204 is then provided to a transmit filter 234 that performs spectral shaping of the continuous-time transmit signal 204 to ensure that the filtered, continuous-time transmit signal 205 substantially resides within the particular frequency band that is appropriate for communication across the communication channel 299.

The transmit driver 230 may also perform any appropriate frequency-conversion (e.g., usually up-converting) that is necessary to get the sequence of discrete-valued modulation symbols 203 (or the discrete-time transmit signals) into a format that comports with the particular type of communication channel 299 across which the filtered, continuous-time transmit signal 205 is to be transmitted. Such frequency conversion is sometimes performed from a baseband frequency to a carrier frequency via an IF (Intermediate Frequency). In alternative embodiments, the frequency conversion may be performed directly from a baseband frequency to a carrier frequency. Ultimately, the resulting, filtered continuous-time transmit signal 205 is then launched into the communication channel 299.

In addition, a digital filter 228 may also be interposed between the encoder and symbol mapper 220 and the transmit driver 230 to allow the operation of the transmit filter 234 (situated after the DAC 232 within the transmit driver 230) to operate more easily and more effectively in shaping the filtered, continuous-time transmit signal 205 to be launched into the communication channel 299.

When the transmitter 297 employs a particular type of encoding and modulation, a corresponding receiver 298 (that receives a signal transmitted from the transmitter 297 via the communication channel 299) is then operable to perform the appropriately corresponding decoding of such an encoded and transmitted signal. In addition, the receiver 298 knows which modulation type (including the constellation shape and mapping of the constellation points therein) has been employed by encoder and symbol mapper 220 of the transmitter 297, so that the receiver 298 may appropriately decode the transmitted sequence of information bearing symbols sent from the transmitter.

In addition, when the transmitter 297 employs uncoded modulation in conjunction with a particular symbol mapping of a constellation, then the receiver 298 is operable to decoding of such a sequence of discrete-valued uncoded modulation symbols with knowledge of the manner in which the information bits have been symbol mapped in the encoder and symbol mapper 220 within the transmitter 297.

Generally speaking, a corresponding receiver 298 is operable to perform appropriate decoding of a continuous-time receive signal 206 with knowledge of the particular manner in which information bits 201 had been encoded and symbol mapped in the encoder and symbol mapper 220 within the transmitter 297.

The filtered, continuous-time transmit signal 205 that has been transmitted across a communication channel 299 (i.e., from the transmitter 297) is received by the receiver 298. At the receiver end of the communication channel 299, this received continuous-time signal may be referred to as a continuous-time receive signal 206. The continuous-time receive signal 206 is provided to an AFE (Analog Front End) 260 that includes a receive filter 262 and an ADC (Analog to Digital Converter) 264. The receive filter 262 that may be implemented to perform spectral shaping of the continuous-time receive signal 206 to ensure suppression of noise and any other undesired signals outside of the transmission band and also to ensure equalization of the continuous-time receive signal 206 within the transmission band. Moreover, this receive filter 262 may operate to perform spectral shaping, in conjunction with a transmit filter 234 at the transmitter end of the communication channel 299 (e.g., in conjunction with the transmit filter 234 within the transmitter 297). This spectral shaping may be performed in the transmitter 297 alone (using the transmit filter 234) or in both the transmitter 297 and the receiver 298 (cooperatively using both the transmit filter 234 and the receive filter 262).

The AFE 260 may also perform any appropriate frequency-conversion (e.g., usually down-converting) that is necessary to get the continuous-time receive signal 206 from the format that comports with the particular type of communication channel 299 to a format that may be processed within the receiver 298. Such frequency conversion is sometimes performed from a carrier frequency to a baseband frequency via an IF (Intermediate Frequency). In alternative embodiments, the frequency conversion may be performed directly from a carrier frequency to a baseband frequency.

This now filtered, continuous-time receive signal 207 (output from the receive filter) is then sampled using an ADC (Analog to Digital Converter) 264 at the modulation rate thereby obtaining discrete-time receive signals 208.

These discrete-time receive signals 208 are then provided to a metric generator 270 where metrics are calculated based on the modulation by which the sequence of discrete values modulation symbols was generated using the symbol mapper 224 within the transmitter 297. For example, the obtained discrete-time receive signals 208 are typically mapped according to the corresponding I, Q (In-phase, Quadrature) values within the constellation having a particular mapping. More specifically, a particular symbol is mapped according to a modulation (i.e., constellation shape and mapping) to which that symbol corresponds. In a perfect communication system 200, an appropriately demodulated, received symbol would map directly onto a constellation point. The metrics calculated by the metric generator 270 typically correspond to the Euclidean distances (sometimes including noise, or noise variance, correction scaling) between the each of the constellation points and the location to which the symbol actually maps.

The metric generator 270 then outputs these symbol metrics 209 to a decoder 280, and the symbol metrics 209 are now employed to perform decoding in a manner that corresponds to the manner in which information bits 201 have been encoded and symbol mapped at the transmitter end of the communication channel 299 (i.e., in the transmitter 297). For example, the decoder 280 may be implemented to perform LDPC decoding or any number of other types of decodings that correspond to the manner in which information bits 201 are encoded at the transmitter end of the communication channel 299.

If required, an equalizer 265 may perform additional equalization (usually implemented as adaptive equalization). Such an equalizer 265 (typically situated after the sampling that is performed by the ADC 264) operates to ensure that the discrete-time receive signals 208 have the characteristics that are required for subsequent estimation of the transmitted sequence of information bearing modulation symbols and the information bits encoded therein. The ultimate outputs of the decoder 280 are best estimates of the discrete-valued modulation symbols and information bits encoded therein 210.

In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Figure 3:
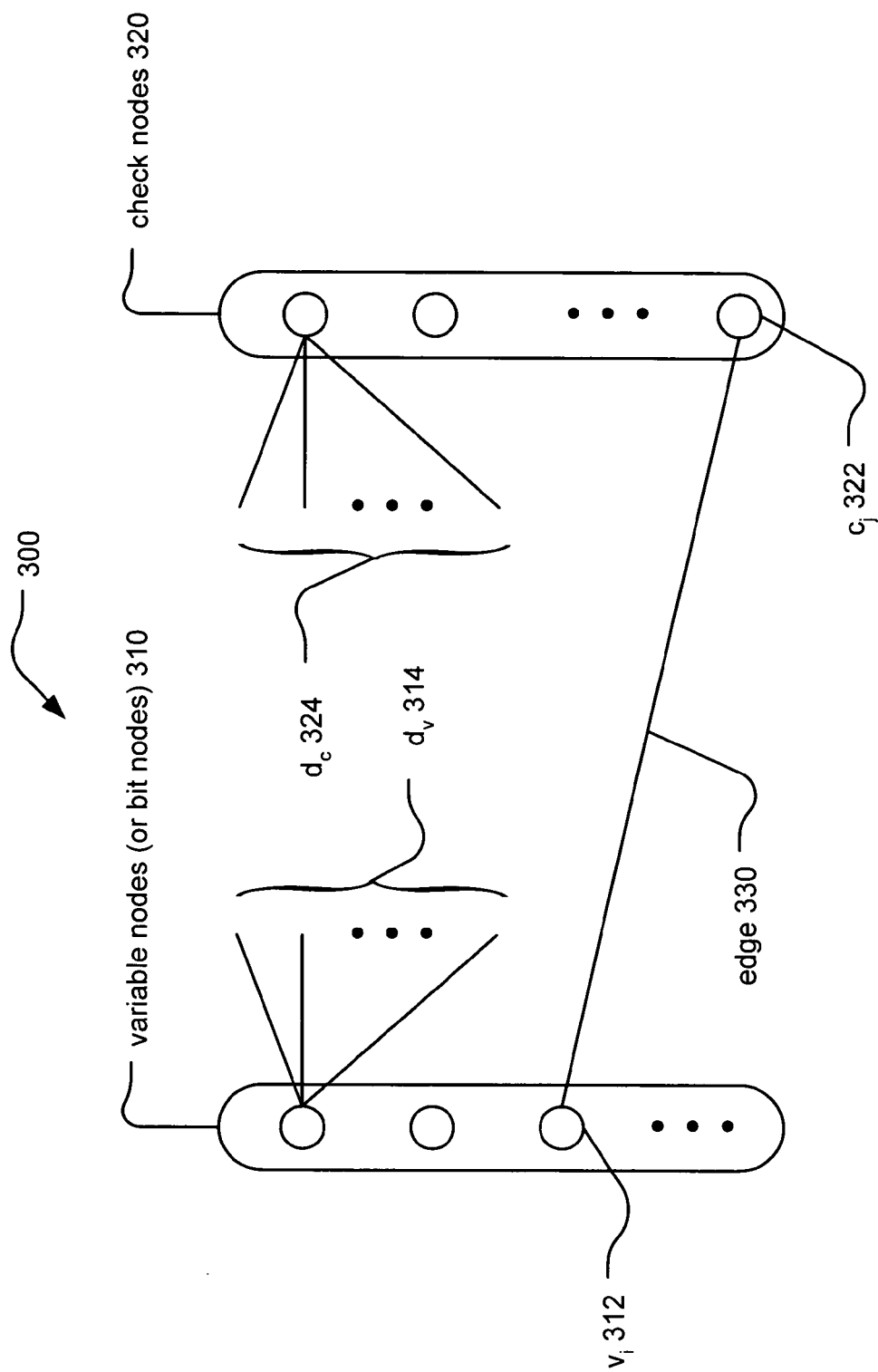
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300.

In the art, an LDPC bipartite graph may also be referred to as a Tanner graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Lugy et al. in [2] also referenced below.

[1] R. Gallager, *Low-Density Parity-Check Codes*, Cambridge, Mass.: MIT Press, 1963.

[2] M. Lugy, M. Mitzenmacher, A. Shokrollahi, D. Spielman, and V. Stemann, "Practical loss-resilient codes," *IEEE Trans. Inform. Theory*, Vol. 47, pp. 569-584, February 2001.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i, j)$. However, on the other hand, given an edge $e=(i, j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e')=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy et al. in [2] referenced above.

In general, with a graph of an LDPC code, the parameters of an LDPC code can be defined by a degree of distribution, as described within M. Lugy et al. in [2] referenced above and also within the following reference:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C = \{v | v = (v_0, \ldots, v_{N-1}), vH^T = 0\}$ being an LDPC code and viewing a received vector, $y = (y_0, \ldots, y_{N-1})$, within the sent signal having the form of $((-1)^{v_{0i}}, \ldots, (-1)^{v_{N-1}})$, then the metrics of the channel may be defined as $p(y_i | v_i = 0)$, $p(y_i | v_i = 1)$, $i = 0, \ldots, N-1$. The LLR of a metric, $L_{metric}(i)$, will then be defined as follows:

$$L_{metric}(i) = \ln \frac{p(y_i | v_i = 0)}{p(y_i | v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 | y_i)}{p(v_i = 1 | y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)},$$

may be replaced by the following $$\ln \frac{p(v_i = 0, vH^T = 0 | y)}{p(v_i = 1, vH^T = 0 | y)} = \sum_{(i,j) \in E_v(i)} \ln \frac{p(v_i = 0, vh_j^T = 0 | y)}{p(v_i = 1, vh_j^T = 0 | y)}$$

where $E_v(i)$ is a set of edges starting with $v_i$ as defined above.

When performing the BP (Belief Propagation) decoding approach in this context, then the value of ln $$\ln \frac{p(v_i = 0, vh_j^T = 0 | y)}{p(v_i = 1, vh_j^T = 0 | y)}$$

may be replaced by the following relationship $$L_{check}(i, j) = \ln \frac{p\left(\sum_{e \in E_c(j) \setminus \{(i,j)\}} v_{v(e)} = 0 | y\right)}{p\left(\sum_{e \in E_c(j) \setminus \{(i,j)\}} v_{v(e)} = 1 | y\right)}$$

$L_{check}(i, j)$ is called the EXT (extrinsic) information of the check node $c_j$ with respect to the edge $(i, j)$. In addition, it is noted that $e \in E_c(j) \setminus \{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge $(i, j)$ may be defined as follows:

$$L_{var}(i, j) = L_{metric}(i) + \sum_{(i,k) \in E_v(i) \setminus \{(i,j)\}} L_{check}(i, k).$$

From certain perspectives, certain aspects of the invention may also be implemented within communication systems that involve combining LDPC coding and modulation to generate LDPC coded modulation signals. These LDPC coded modulation signals may also be of the type that they have a code rate and/or modulation (constellation and mapping) that varies as frequently as on a frame by frame basis and/or as frequently as on a symbol by symbol basis.

Figure 4:
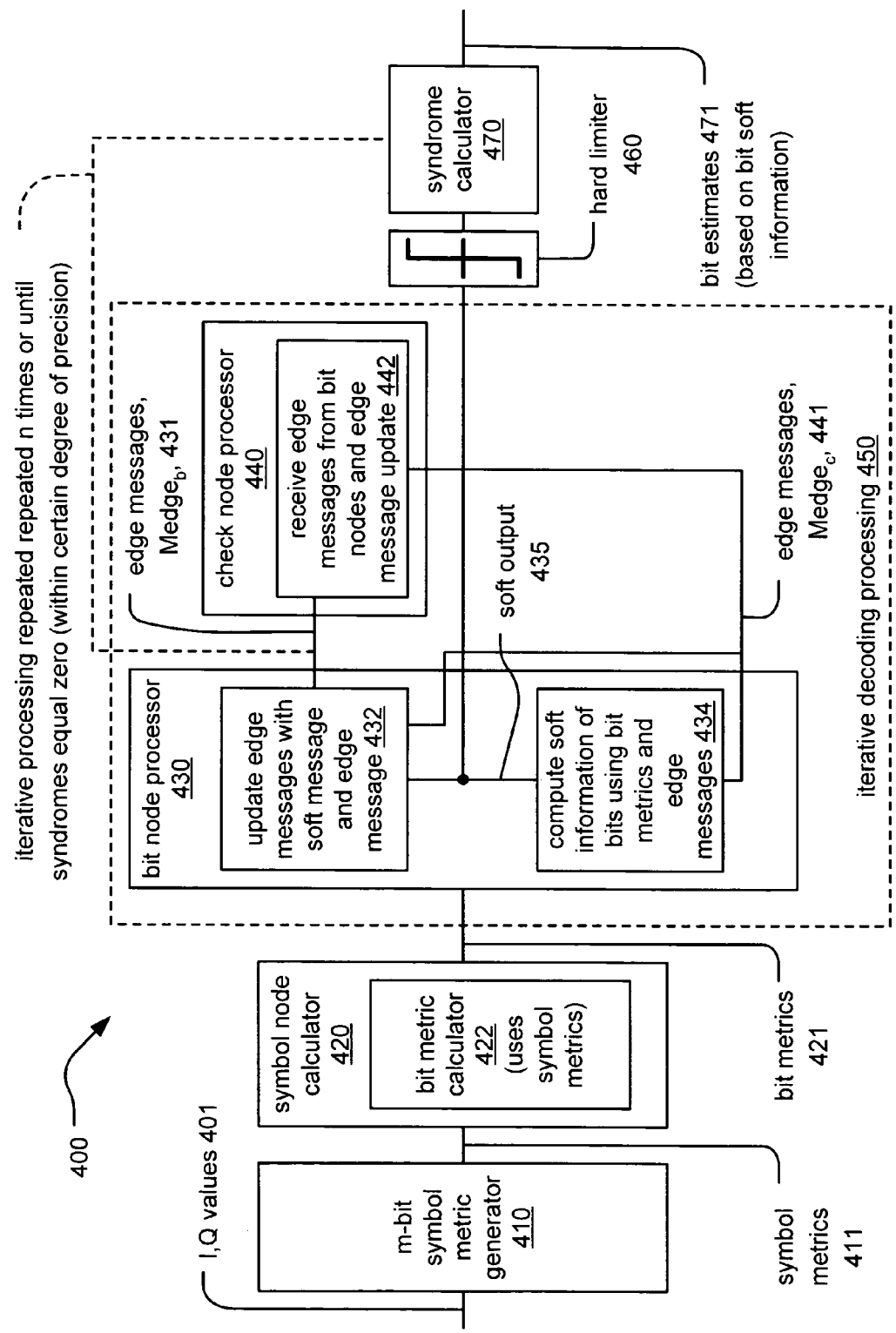
FIG. 4 is a diagram illustrating an embodiment of LDPC (Low Density Parity Check) decoding functionality using bit metric according to certain aspects of the invention.

FIG. 4 is a diagram illustrating an embodiment of LDPC (Low Density Parity Check) decoding functionality using bit metric 400 according to certain aspects of the invention. To perform decoding of an LDPC coded signal having an m-bit signal sequence, the functionality of this diagram may be employed. After receiving the I, Q (In-phase, Quadrature) values 401 of a signal at the symbol nodes, an m-bit symbol metric generator 410 calculates the corresponding symbol metrics 411. At the symbol nodes, these symbol metrics 411 are then passed to a symbol node calculator functional block 420 that uses these received symbol metrics 411 to calculate the bit metrics 421 corresponding to those symbols. These bit metrics 421 are then passed to the bit nodes connected to the symbol nodes according to the LDPC code bipartite graph by which the LDPC coded signal has been generated and by which it is to be decoded.

Thereafter, at the bit nodes, a bit node processor 430 operates to compute the corresponding soft messages of the bits. Then, in accordance with iterative decoding processing 450, the bit node processor 430 receives the edge messages with respect to the check nodes, $Medge_c$ 441, from a check node processor 440 and updates the edge messages with respect to the bit nodes, $Medge_b$ 431, with the bit metrics 421 received from the symbol node calculator functional block 420. These edge messages with respect to the bit nodes, $Medge_b$ 431, after being updated, are then passed to the check node processor 440.

At the check nodes, the check node processor 440 then receives these edge messages with respect to the bit nodes, $Medge_b$ 431, (from the bit node processor 430) and updates the them accordingly thereby generating the next updated version of edge messages with respect to the check nodes, $Medge_c$ 441. These updated edge messages with respect to the check nodes, $Medge_c$ 441, are then passed back to the bit nodes (e.g., to the bit node processor 430) where the soft information of the bits is calculated using the bit metrics 421 and the current iteration values of the edge messages with respect to the bit nodes, $Medge_b$ 431. Thereafter, using this just calculated soft information of the bits (shown as the soft output 435), the bit node processor 430 updates the edge messages with respect to the bit nodes, $Medge_b$ 431, using the previous values of the edge messages with respect to the bit nodes, $Medge_b$ 431 (from the just previous iteration) and the just calculated soft output 435. The iterative decoding processing 450 continues between the bit nodes and the check nodes (i.e., between the bit node processor 450 and the check node processor 440) according to the LDPC code bipartite graph that was employed to encode and generate the signal that is being decoded.

These iterative decoding processing steps, performed by the bit node processor 430 and the check node processor 440, are repeated a predetermined number of iterations (e.g., repeated n times, where n is selectable). Alternatively, these iterative decoding processing steps are repeated until the syndromes of the LDPC code are all equal to zero (within a certain degree of precision).

The soft output 435 is generated within the bit node processor 430 during each of the decoding iterations. In this embodiment, this soft output 435 may be provided to a hard limiter 460 where hard decisions may be made, and that hard decision information may be provided to a syndrome calculator 470 to determine whether the syndromes of the LDPC code are all equal to zero (within a certain degree of precision that may be selected by a designer or adaptively modified in real time in response to one or more operational parameters). That is to say, the syndrome calculator 470 determines whether each syndrome associated with the LDPC code is substantially equal to zero as defined by some degree of precision (either predetermined degree or adaptively determined degree). For example, when a syndrome has a mathematically non-zero value that is less than some threshold as defined by a predetermined degree of precision, then that syndrome is deemed to be substantially equal to zero. Also, when a syndrome has a mathematically non-zero value that is less than some threshold as defined by an adaptively determined degree of precision, then that syndrome is deemed to be substantially equal to zero. When a syndrome has a mathematically non-zero value that is greater than the threshold as defined by a predetermined degree of precision, then that syndrome is deemed to be substantially not equal to zero. Also, when a syndrome has a mathematically non-zero value that is greater than the threshold as defined by an adaptively determined degree of precision, then that syndrome is deemed to be substantially not equal to zero. When the syndromes are not substantially equal to zero, the iterative decoding processing 450 continues again by appropriately updating and passing the edge messages between the bit node processor 430 and the check node processor 440. For example, the edge messages with respect to the bit nodes, $Medge_b$ 431, are passed to the check node processor 440 from the bit node processor 430. Analogously, the edge messages with respect to the check nodes, $Medge_c$ 441, are passed to the bit node processor 430 from the check node processor 440 from.

After all of these steps of the iterative decoding processing 450 have been performed, then the best estimates of the bits (shown as bit estimates 471) are output based on the bit soft information. In the approach of this embodiment, the bit metric values that are calculated by the symbol node calculator functional block 420 are fixed values and used repeatedly in updating the bit node values.

Figure 5:
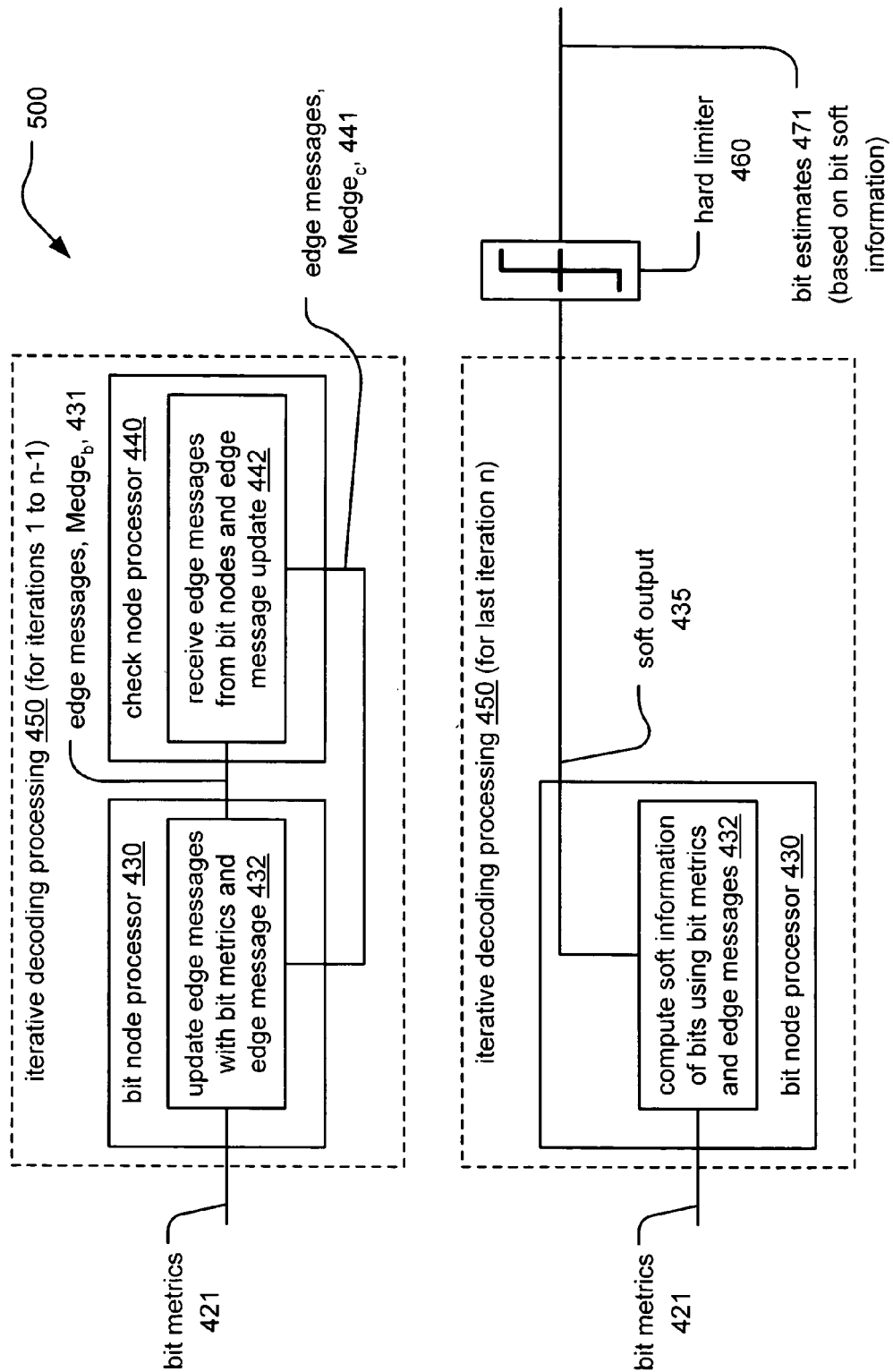
FIG. 5 is a diagram illustrating an alternative embodiment of LDPC decoding functionality using bit metric according to certain aspects of the invention (when performing n number of iterations).

FIG. 5 is a diagram illustrating an alternative embodiment of LDPC decoding functionality using bit metric 500 according to certain aspects of the invention (when performing n number of iterations). This embodiment shows how the iterative decoding processing 450 of the FIG. 4 may be performed when a predetermined number of decoding iterations, shown as n, is performed. If the number of decoding iterations is known beforehand, as in a predetermined number of decoding iterations embodiment, then the bit node processor 430 may perform the updating of its corresponding edge messages with respect to the bit nodes, $Medge_b$ 431, using the bit metrics 421 themselves (and not the soft output 435 as shown in the previous embodiment and described above). This processing may be performed in all but the last decoding iteration (e.g., for iterations 1 through n−1). However, during the last iteration, the bit node processor 430 calculates the soft output 435. The soft output 435 is then provided to the hard limiter 460 where hard decisions may be made of the bits. The syndromes need not be calculated in this embodiment since only a predetermined number of decoding iterations are being performed.

Oftentimes, when implementing LDPC decoding functionality into actual communication devices and hardware, a critical design consideration is how to implemented the hardware so that the calculations may be performed as quickly as possible and also with the highest degree of accuracy as possible. Also, hardware implementations of such LDPC decoding functionality can be implemented within the logarithmic domain (or "log domain" for short). In doing this, the hardware implementations can sometimes be simplified, in that, the multiplication processes may be reduced to additions, and the division processes may be reduced to subtractions. Oftentimes, the difficulty in implementing the calculations necessary to perform the LDPC decoding processing lie in the difficult to implement the calculations necessary to perform check node processing. For example, the calculations performed within a check node processor (or bit-check processor that is performing check node processing) often require the determination of a minimum (or maximum) value from among a number of possible values. When these calculations are performed in actual hardware whose calculations are implemented in the log domain, this often involves determining this minimum (or maximum) value at the cost of some precision. That is to say, without employing some log correction factor within the calculations, then a loss of precision may be incurred. Even when implemented in the log domain, some prior art decoding approaches only select a minimum (or maximum) value from among a number of possible values without employing any log correction factor. This inherently introduced some imprecision when selecting a minimum (or maximum) value from among a number of possible values when operating in the log domain.

Figures 6A, 6B:
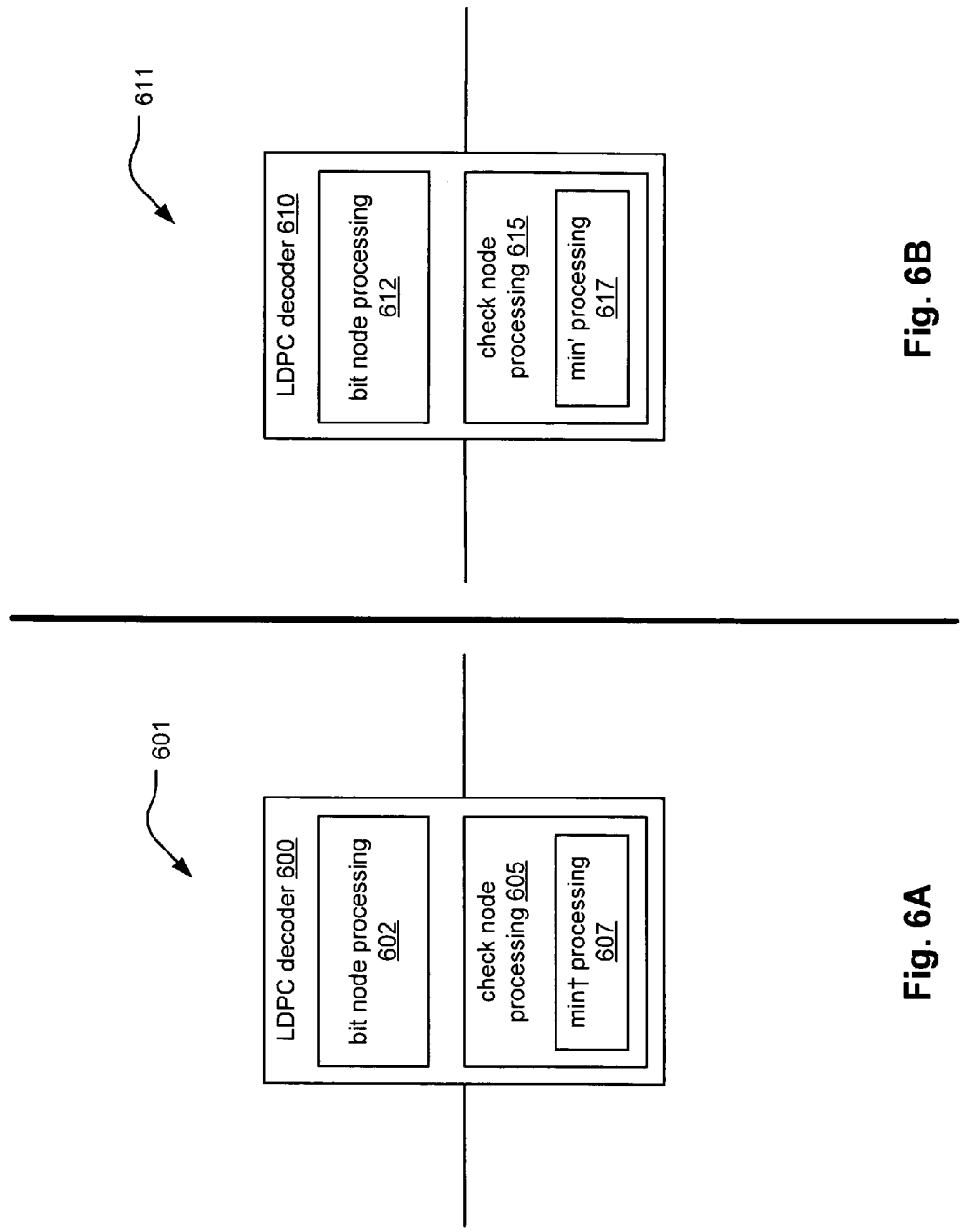
FIG. 6A is a diagram illustrating an embodiment of an LDPC decoder employing min† (min-dagger) processing in accordance with certain aspects of the invention.
FIG. 6B is a diagram illustrating an embodiment of an LDPC decoder employing min' (min-prime) processing in accordance with certain aspects of the invention.

FIG. 6A is a diagram illustrating an embodiment 601 of an LDPC decoder 600 employing min† (min-dagger) processing 607 in accordance with certain aspects the invention. This embodiment shows an LDPC decoder 600 that performs min† processing 607 of at least two values to generate an output value during its decoding processing of a received signal. This embodiment shows a very generic situation where an LDPC decoder 600, that may itself by implemented within any number of communication devices (e.g., receivers, transceivers, and so on) within any number of communication systems, performs min† processing 607 during the decoding processing.

Within the context of LDPC decoding, the LDPC decoder 600 performs both bit node processing 602 and check node processing 605. The check node processing 605 includes performing the min† processing 607 when updating the edge messages with respect to the check nodes, Medge$_c$, during the iterative decoding processing.

FIG. 6B is a diagram illustrating an embodiment 611 of an LDPC decoder 610 employing min' (min-prime) 617 processing in accordance with certain aspects of the invention. This embodiment shows an LDPC decoder 610 that performs min' processing 617 of at least two values to generate an output value during its decoding processing of a received signal. This embodiment shows a very generic situation where an LDPC decoder 610, that may itself by implemented within any number of communication devices (e.g., receivers, transceivers, and so on) within any number of communication systems, performs min' processing 617 during the decoding processing.

Similar to the embodiment described above, within the context of LDPC decoding, the LDPC decoder 610 performs both bit node processing 612 and check node processing 615. The check node processing 615 includes performing the min' processing 617 when updating the edge messages with respect to the check nodes, Medge$_c$, during the iterative decoding processing.

In general, these two very generically shown LDPC decoders may be implemented within any of a variety of communication devices and within any of a variety of communication systems including any one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system, among other types of communication systems.

Decoding LDPC Coded Signals

There are two steps that are performed within each decoding iteration that is performed by an LDPC code decoder. One of the steps is using bit information to update edge information. In this disclosure, this first step is referred to as B2C (for the "bit-to-check" step); this may be referred to as check node processing or updating of the edge messages with respect to the check nodes, Medge$_c$. The second of the steps is using check information to update the edge information. In this disclosure, this second step is referred to as C2B (for the "check-to-bit" step); this may be referred to as bit node processing or updating of the edge messages with respect to the bit nodes, Medge$_b$.

In this disclosure, a novel approach is provided using new approximate operators for the B2C step or the "check node processing" step. Suppose a bit, b, corresponds to the edges, $e_0, e_1, \ldots, e_m$. Let the LLR (Log-Likelihood Ratio) information of the edges passed to b from the C2B step of the previous decoding iteration be represented as $L_b(e_i), i=0, \ldots, m$.

In previously filed, and pending, U.S. provisional patent application and U.S. utility patent application (BP2259), incorporated herein by reference above, having common inventorship as the present patent application and also having a common assignee (Broadcom Corporation), it is shown and described in detail how the updated edge information of $e_i$ can be computed.

The following description is used to show basic computations that need be performed check node processing (sometimes referred to as calculating the check node extrinsic information value) that is used subsequently for decoding a variable bit within a received signal.

The basic computation may be may be described as beginning with the random variables, $v_1, v_2, \ldots, v_k$ having values in $\{0,1\}$ (zero or one) and with the probability $p_i(0)$ and $p_i(1), i=1,2, \ldots, k$. The denotation of the logarithmic ratio of these probabilities is shown below:

$$L(v_i)=\ln[p_i(1)/p_i(0)], i=1,2, \ldots, k$$

It may also be shown, as by the authors in J. Hagenauer, E. Offer and L. Papke, "Iterative decoding of binary block and convolutional codes," *IEEE Trans. Inform. Theory*, Vol. 42, No. 2 March 1996, pp. 429-445, that the extrinsic information value for a sum of random variables may be shown as follows:

$$L(v_1 + v_2) = \ln\frac{p(v_1 + v_2 = 1)}{p(v_1 + v_2 = 0)} = \ln\frac{1 + \exp(L(v_1) + L(v_2))}{\exp(L(v_1)) + \exp(L(v_2))}$$

Using this relationship, the following relationship may be made.

$$L\left(\sum_{i=1}^{k} v_i\right) = \ln\frac{p\left(\sum_{i=1}^{k} v_i = 1\right)}{p\left(\sum_{i=1}^{k} v_i = 0\right)} = L\left(\left[\sum_{i=1}^{k-1} v_i\right] + v_k\right) \quad \text{(EQ 1)}$$

The computation of this function may be performed using the following function:

$$f(x, y) = \ln\frac{1 + \exp(x + y)}{\exp(x) + \exp(y)}$$

This function may be further simplified as follows:

$$f(x, y) = \text{sign}(x) \cdot \text{sign}(y) \cdot \ln \frac{1 + \exp(|x| + |y|)}{\exp(|x|) + \exp(|y|)}; \quad \text{(EQ 2)}$$

$$\text{where sign}(x) = \begin{cases} 1, & x \geq 0 \\ -1, & x < 0 \end{cases}$$

Since $|x|, |y| \geq 0$, we have $\exp(|x|)(\exp(|y|) - 1) \geq \exp(|y|) - 1$, and therefore the following relationship may be made:

$$\ln \frac{1 + \exp(|x| + |y|)}{\exp(|x|) + \exp(|y|)} \geq 0 \quad \text{(EQ 3)}$$

By using the Equations 2 and 3 above, the following two relationships may be made.

$$\text{sign}(f(x, y)) = \text{sign}(x)\text{sign}(y)$$

$$|f(x, y)| = f(|x|, |y|)$$

Continuing on, the following relationships may be achieved:

$$f(x, y) = \text{sign}(x)\text{sign}(y) f(|x|, |y|) \quad \text{(EQ 4)}$$

To generalize this function to functions having more variable, the following relationship may be made:

$$f(x_1, x_2, \ldots, x_k) = f(f(x_1, \ldots, x_{k-k}), x_k) \quad \text{(EQ 5)}$$

In addition, the following relationships may be achieved as well:

$$f(x_1, \ldots, x_k) = \left(\prod_{i=1}^{n} \text{sign}(x_i)\right) f(|x_1|, \ldots, |x_k|) \quad \text{(EQ 6)}$$

The following two relationships may then be employed when performing the decoding of an LDPC code.

$$\text{sign}(f(x_1, \ldots, x_n)) = \left(\prod_{i=1}^{n} \text{sign}(x_i)\right), \text{ and}$$

$$|f((x_1, \ldots, x_k)| = f(|x_1|, \ldots, |x_k|)$$

A brief proof of the preceding relationship is shown below. In the earlier case, the value of k was 2. Continuing on, if we operate on the supposition that (EQ 6) is in fact true when k=n−1. If we use Equations 4 and 5, and by also using the following relationship:

$$(f(x_1, \ldots, x_n) = (\text{sign}(f(x_1, \ldots, x_{n-1}))$$

$$\text{sign}(x_n) f(|f(x_1, \ldots, x_{n-1})|, |x_n|)$$

$$= \left[\prod_{i=1}^{n} \text{sign}(x_i)\right] f(f(|x_1|, \ldots, |x_{n-1}|, |x_n|)$$

$$= \left[\prod_{i=1}^{n} \text{sign}(x_i)\right] f(|x_1|, \ldots, |x_n|).$$

Now, the L function defined above within the (EQ 1) may then be described by the relationship shown below.

$$L\left(\sum_{i=1}^{k} v_i\right) = f(L(v_1), \ldots, L(v_k)) \quad \text{(EQ 7)}$$

$$= \left[\prod_{i=1}^{k} \text{sign}(L(v_i))\right] f(|L(v_1)|, \ldots, |L(v_k)|)$$

A common calculation that is performed when decoding an LDPC signal includes the computation and approximation of the function: $f(|x|, |y|)$.

From the definition of $f(|x|, |y|)$, the following relationship may be made.

$$f(|x|, |y|) = \ln \frac{1 + \exp(-(|x| + |y|))}{\exp(-|x|) + \exp(-|y|)} \quad \text{(EQ 8)}$$

$$f(|x|, |y|) = -\ln(\exp(-|x|) + \exp(-|y|)) + \ln(1 + \exp(-(|x| + |y|)))$$

$$f(|x|, |y|) = \min(|x|, |y|) + \ln\left[\frac{1 + \exp(-(|x| + |y|))}{1 + \exp(-||x| - |y||)}\right]$$

$$= \min^{**}(|x|, |y|)$$

We denote the right side of the last equation by the min function, or more specifically shown as min(|x|,|y|). The min* function is provided here for comparison to the min** function.

For any real values x and y, the calculation of min* may be described as below. The min* calculation includes finding an actual minimum and also a natural log base e ($\log_e = \ln$) correction factor.

$$\min^*(x, y) = -\ln(e^{-x} + e^{-y})$$

In general, we define $\min^*(x_1, \ldots, x_N) = \min^*(\min^*(x_1, \ldots, x_{N-1}), x_N)$. Using induction, one can prove the following relationship:

$$\min^*(x_1, \ldots, x_N) = -\ln(e^{-x_1} + e^{-x_2} + \ldots + e^{-x_N})$$

From the min* relationship shown above, we have $$\min^*(x, y) = \begin{cases} -\ln(e^{-x}(1 + e^{x-y})), & x \leq y \\ -\ln(e^{-y}(1 + e^{y-x})), & x > y \end{cases}$$

$$= \min(x, y) - \ln(1 + e^{-|x-y|})$$

This equation may also be simplified as shown below:

$$\min^*(x, y) = \min(x, y) - \ln(1 + e^{-|x-y|})$$

It is noted that the min** function also has some similarities to the min* function. For example, similar to the definition of min*, part of the min** function, shown as ln $$\ln\left[\frac{1 + \exp(-(|x| + |y|))}{1 + \exp(-||x| - |y||)}\right],$$

may be considered as a natural log base e ($\log_e = \ln$) correction factor that only needs a read-only memory (ROM), or some other memory storage device, to store some possible values of that portion. One example of how such storage may be performed may be found in E. Eleftheriou, T. Mittelholzer and A. Dholakia, "Reduced-complexity decoding algorithm for low-density parity-check codes," *IEEE Electronic Letters*, Vol. 37, pp. 102-104, January 2001.

Moreover, we denote $\min^{}(x_1, \ldots, x_n) = \min^{}(\min^{**}((x_1, \ldots, x_{n-1}), x_n))$ Using this relationship, then the relationship of (EQ 7) may be described as the following relationship:

$$L\left(\sum_{i=1}^{k} v_i\right) = \left[\prod_{i=1}^{k} \text{sign}(L(u_i))\right] \min^{**}\{|L(v_1)|, \ldots, |L(v_k)|\}$$

In taking the first part of the right side of the second equation in (EQ 8), the authors of J. Hagenauer, E. Offer, and L. Papke, "Iterative decoding of binary block and convolutional codes," *IEEE Trans. Inform. Theory*, Vol. 42, No. 2 March 1996, pp. 429-445 had suggested to use the approximation $f(|x|,|y|) \approx \min(|x|,|y|)$.

With this approximation, the (EQ 7) may then be described as follows:

$$L\left(\sum_{i=1}^{k} v_i\right) \approx \left[\prod_{i=1}^{k} \text{sign}(L(u_i))\right] \min\{|L(v_1)|, \ldots, |L(v_k)|\}$$

However, this proposed solution is a very significant compromise of the accuracy of the calculation. As a result of such a significant compromise in accuracy, a great loss is performance is undesirably realized using such an approach. A much better approximation that includes the appropriate logarithmic correction may be employed as follows:

Approximate $f(|x|,|y|)$ as follows:

$$f(|x|,|y|) \approx \min^*(|x|,|y|) = \min(|x|,|y|) - \ln(1 + e^{-||x|-|y||})$$

It is especially noted here that this approximation shown above does not result in any performance loss. This way, a simplification may be made in the operations performed without any performance loss thereby achieving a more efficient implementation.

With this approximation, the relationship of the (EQ 7) will then become $$L\left(\sum_{i=1}^{k} v_i\right) = \left[\prod_{i=1}^{k} \text{sign}(L(u_i))\right] \min^*\{|L(v_1)|, \ldots, |L(v_k)|\}$$

The following description employs the various relationships described above in performing LDPC decoding. The application of the (EQ 7) is made to an LLR decoder. In doing so, the value of $L(v_i)$ is replaced by $L_{var}^{n-1}(i, j)$ with respect to the edge (i, j). In doing so, then the extrinsic information value of the check node with respect to the edge (i, j), shown as $L_{check}^n(i, j)$, will become:

$$L_{check}^n(i, j) = \left[\prod_{e \in E_c(j) \setminus \{(i,j)\}} \text{sign}(L_{var}^{n-1}(e))\right] \quad \text{(EQ 9)}$$

$$f(\{|L_{var}^{n-1}(e)| | e \in E_c(j) \setminus \{(i, j)\}\})$$

Alternatively, this updating of the edge information of $e_i$, with respect to the check nodes, can be computed and represented as follows:

$$L_c(e_i) = \left[\prod_{j \neq i} \text{sign}(L_b(e_j))\right] f(|L_b(e_0)|, \ldots, |L_b(e_{i-1})|, \quad \text{(EQ 10)}$$

$$|L_b(e_{i+1})|, \ldots, |L_b(e_m)|)$$

where $$f(x, y) = \ln \frac{1 + \exp(x + y)}{\exp(x) + \exp(y)} \text{ and} \quad \text{(EQ 11)}$$

$$f(x_1, x_2, \ldots, x_k) = f(f(x_1, x_2, \ldots, x_{k-1}), x_k) \quad \text{(EQ 12)}$$

Moreover, we have the following relationship:

$$f(|x|, |y|) = \min(|x|, |y|) + \ln\left[\frac{1 + \exp(-(|x| + |y|))}{1 + \exp(-||x| + |y||)}\right] \quad \text{(EQ 13)}$$

We denote the right hand side of (EQ 13) by $\min^{**}(|x|, |y|)$.

In order to simplify the operation of the (EQ 13), in the BP2559 related patent applications referenced above, the min* operator is introduced as is also shown below:

$$\min^*(x, y) = \min(x, y) - \ln(1 + e^{-|x-y|}) \quad \text{(EQ 14)}$$

This min* operator (alternatively: min-star operator) may be viewed as being a calculation that provides an approximation of the function, $f(x, y)$, that is shown above.

In the software provided by Hughes Network Systems (HNS) for DVBS2 (Digital Video Broadcasting Standard 2), the updated edge information of $e_i$ (e.g., represented as, $L_b(e_i)$) is estimated as described below. Denote m values of the LLR information as $L_b(e_0), \ldots, L_b(e_{i-1})$, $L_b(e_{i+1}), \ldots, L_b(e_m)$ for $x_0, \ldots, x_{m-1}$. Let $$L^{(j)} = \begin{cases} 0, & \min(|x_0|, |x_1|) = 0 \\ \text{sign}(x_j)\text{sign}(L^{(j-1)})\min^*(|x_0|, |x_1|) & \text{otherwise} \end{cases} \quad \text{(EQ 15)}$$

and suppose $L^{(j-1)}$ is computed, then $$L^{(j)} = \begin{cases} 0, & \min(|x_j|, |L^{(j-1)}|) = 0 \\ \text{sign}(x_j)\text{sign}(L^{(j-1)})\min^*(|x_j|, |L^{(j-1)}|) & \text{otherwise} \end{cases} \quad \text{(EQ 16)}$$

Finally, based on these relationships provided above, the value for the updated edge information of $e_i$ (e.g., represented as, $L_c(e_i)$) is approximated as follows:

$$L_c(e_i) \approx L^{(m-1)} \quad \text{(EQ 17)}$$

New Approximate Operators Based on min*

Various aspects of the invention provide for new approximate operators based on the operators employed within min* processing.

Suppose $x, y \geq 0$, then $\exp(x) \geq 1$ and $(\exp(y)-1) \geq 0$ thus $\exp(x)(\exp(y)-1) \geq (\exp(y)-1)$.

This implies the following:

$1+\exp(x+y) \geq \exp(x)+\exp(y)$

Thus, we have
Property 1:

If $x, y \geq 0$, then (EQ 18)

$$\min^{**}(x, y) = f(x, y) = \ln\left(\frac{1+\exp(x+y)}{\exp(x)+\exp(y)}\right) \geq 0.$$

This may be referred to as min processing of the inputs of x and y (alternatively: min-double-star processing)). The min operator may also be referred to as the min-double-star operator.

Therefore, if the edge information, $x_0, \ldots, x_{m-1}$, are all positive, then using (EQ 10) and Property 1 (from above), then all of the newly updated edge information is also greater than or equal to zero (e.g., $f(x_0, \ldots, x_{m-1}) \geq 0$).

By further considering the min* operator, the following property may be seen.

Property 2:
If $x+y \geq 2 \ln(2)$, then $\min^*(x, y) < 0$. (EQ 19)

The proof of this property 2 is provided below:
Since $x+y \geq 2 \ln(2)$, then $\exp((x+y)/2) < 2$. This implies the following:

$\exp(x+y) < 2 \exp((x+y)/2)$ (EQ 20)

On the other hand, because of the following relationship, $\exp(x)+\exp(y)-2 \exp((x+y)/2)=(\exp(x/2)-\exp(y/2))^2 \geq 0$, (EQ 21)

then the following relationship also holds.

$\exp(x)+\exp(y) \geq 2 \exp((x+y)/2)$ (EQ 22)

By combining (EQ 13) and (EQ 11), the following relationship may be made:

$\exp(x)+\exp(y) \geq \exp(x+y)$ (EQ 23)

Therefore, the following relationship is also true: $\exp(-x)+\exp(-y)>1$.

It is appropriate here to provide the definition of the operation being performed within min* processing (as well as max* processing).

The min* processing functionality described herein may be better understood by the following description. The min* processing includes determining a minimum value from among two values (e.g., shown as min(A, B) in min* processing) as well as determining a logarithmic correction factor (e.g., shown as $\ln(1+e^{-|A-B|})$ in min* processing) in selecting the smaller metric. In addition, it is also noted that max* processing may alternatively be performed in place of min* processing. The max* processing operation also includes a logarithmic correction in selecting the larger metric. It is noted that the various embodiments of the invention may be implemented using the max* operations in lieu of the min* operation when preferred in a given implementation.

The min* processing (or min-star processing), when operating on inputs A and B, may be expressed as follows:

$\min^*(A, B)=\min(A, B)-\ln(1+e^{-|A-B|})$

Again, the min* processing may alternatively be performed using max* processing. The max* processing, when operating on inputs A and B, may be expressed as follows:

$\max^*(A, B)=\max(A, B)+\ln(1+e^{-|A-B|})$

Moreover, when multiple min* operations are to be performed on multiple values (e.g., more than 2), the min* processing may be expressed as follows:

$\min^*(x_1, \ldots, x_N)=\min^*(\min^*(x_1, \ldots, x_{N-1}), x_N)$

Then, by the definition of the operation being performed within min* processing, the following relationship can be made:

$\min^*(x, y)=-\ln(\exp(-x)+\exp(-y))<0$ (EQ 24)

The Property 2 shown and described above shows that even when both x and y are positive, the min* result from these 2 values can nevertheless be negative. However, by the Property 1, shows that for positive valued x and y, the min** result of the two values is always non-negative (e.g., always positive). Clearly, the processing results when using a min* processing operation could potentially be significantly different than when using a min** processing operation for the same input. Therefore, the very fact that the software provided by HNS for DVBS2 uses a min* processing operation to estimate a min** processing related operation could result in significant error for certain values of inputs.

Figure 7:
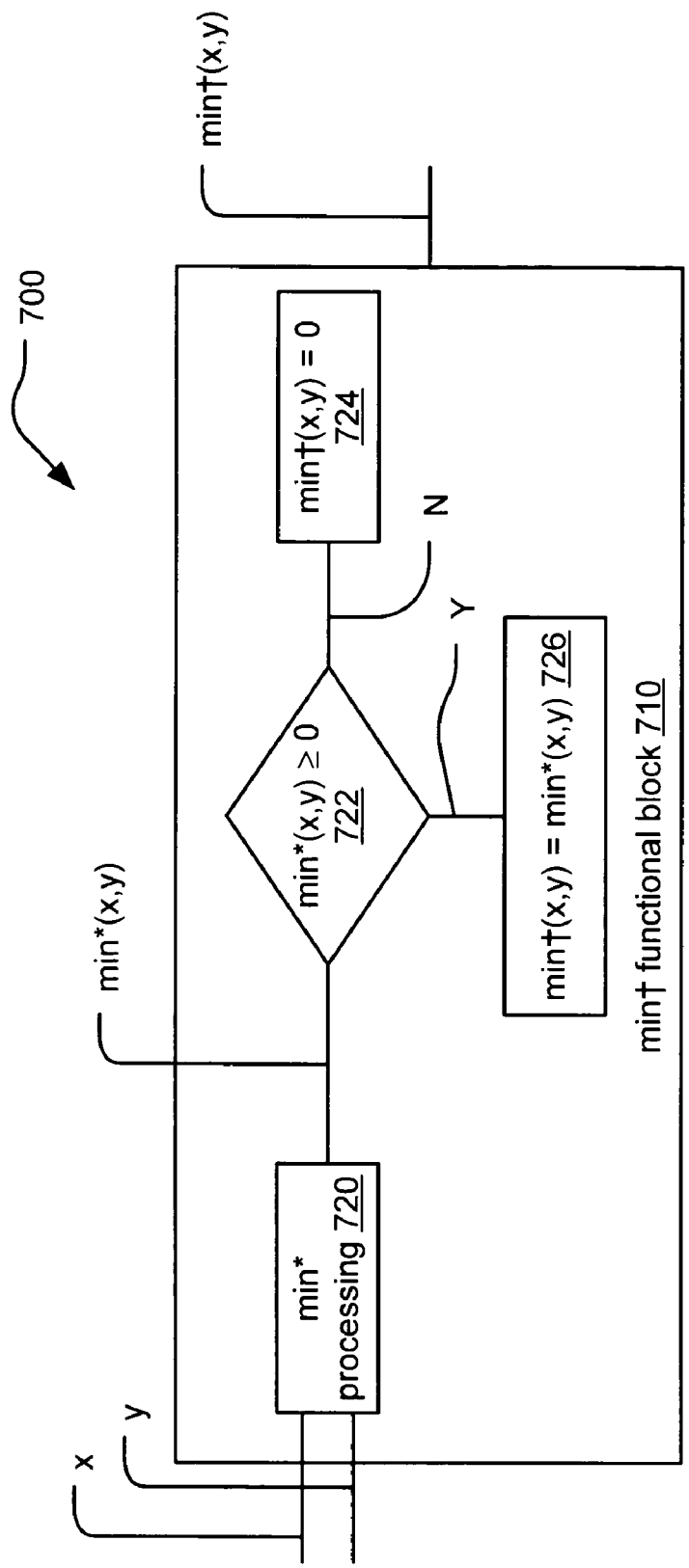
FIG. 7 is a diagram illustrating an embodiment of processing of a min† (min-dagger) functional block in accordance with certain aspects of the invention.

Min† (Min-Dagger) Operator:

FIG. 7 is a diagram illustrating an embodiment 700 of processing of a min† (min-dagger) functional block 710 in accordance with certain aspects of the invention.

A new operator, depicted as the min† operator, or min-dagger operator (whose operation/processing may be also referred to as min† processing (or min-dagger processing)), is introduced as follows:

$$\min\dagger(x, y) = \begin{cases} \min^*(x, y) & \min^*(x, y) \geq 0 \\ 0 & \text{otherwise} \end{cases} \text{ and}$$ (EQ 25)

$\min\dagger(x_0, x_1, \ldots, x_k) =$ (EQ 26)

$\min\dagger(\min\dagger(x_0, x_1, \ldots, x_{k-1}), x_k)$.

In this diagram, two inputs, x and y, are provided to a min† functional block 710. These two inputs, x and y, undergo min* processing as shown in a min* processing functional block 720. When the result of the min* processing functional block 720 is greater than or equal to zero within a degree of precision that may be defined by a designer as shown in a block 722, then the resultant of the min† processing is set to be the resultant of the min* processing functional block 720 as shown in a block 726. Alternatively, when the result of the min* processing functional block 720 is not greater than or equal to zero within a degree of precision that may be defined by a designer, then the resultant of the min† processing is set to be zero as shown in a block 724.

Some comparative examples are provided below showing the different levels of precision that are obtained when using min† processing, when compared to min* processing, min** processing, as well as the processing performed by the software provided by HNS for DVBS2.

EXAMPLE 1

Within the following example, the inputs are as follows:

$\{x_1, x_2, x_3, x_4\} = \{0.5, 0.3, 1, 0.25\}$

Results from Min** Processing:

$\min^{**}\{0.5, 0.3, 1, 0.25\} = 0.00419$

Results from Min* Results:

$\min^{*}\{0.5, 0.3, 1, 0.25\} = -0.9139$

Results from Software Provided by HNS for DVBS2:

$a = \min^{*}(0.5, 0.3)$ and $b = \text{sign}(a)\min^{*}(|a|,1) = 0.10443$

The final results are then as follows:

final result $= \text{sign}(b)\min^{*}(|b|,0.25) = -0.51858$

Results from min† Processing:

$$\min\dagger\{0.5, 0.3, 1, 0.25\} = \begin{cases} \min\dagger\{\min\dagger(0.5, 0.3), 1, 0.25\} \\ \min\dagger\{0, 1, 0.25\} \\ \min\dagger\{\min\dagger(0, 1), 0.25\} \\ \min\dagger\{0, 0.25\} \end{cases} = 0$$

Therefore, min† is, at least among these other 3 possible means by which to calculate an approximation to min**, the best approximation (e.g., 0 is closer to 0.00419 than any of the results from min* processing or the software provided by HNS for DVBS2).

Property 3:

Let $x_0, \ldots, x_{m-1}$ be non-negative numbers. If $\min\dagger\{x_0, \ldots, x_i\} = 0$ for some $i < m-1$, then $\min\dagger\{x_0, \ldots, x_{m-1}\} = 0$.

The proof of this property 3 is provided below:

Since $\min^{*}(0, x) = \min\{0, x\} - \ln(1+\exp(-|x|)) < \min\{0, x\} \leq 0$, we have $$\min\dagger(0, x) = 0. \quad (EQ\ 27)$$

Thus, $$\min\dagger\{x_0, x_1, \ldots, x_k\} = \min\dagger\{\min\dagger(\{x_0, x_1, \ldots, x_i\}, x_{i+1}, \ldots, x_{m-1})\}$$
$$= \min\dagger\{0, x_{i+1}, \ldots, x_{m-1}\}$$
$$= \min\dagger\{\min\dagger(\{0, x_{i+1}\}, x_{i+2}, \ldots, x_{m-1})\} = \ldots$$
$$= \min\dagger(0, x_{m-1}) = 0$$

This following property may save latency when implementation such min† processing in hardware.

Property 4:

If among m positive numbers $x_0, \ldots, x_{m-1}$ there are always two numbers, denoted as $x_i, x_j$ satisfying $x_i + x_j < 2\ln(2)$, then $\min\dagger\{x_0, \ldots, x_{m-1}\} = 0$.

The proof of this property 4 is provided below:

Suppose $i < j$. Since the following relationship holds true, $\min^{*}(x, y) = \min\{x, y\} - \ln(1+\exp(-|x-y|)) < \min\{x, y\}$ we have $\min^{*}(\{x_0, x_1, \ldots, x_i\}) \leq x_i$. Thus, $\min\dagger\{x_0, \ldots, x_i\} \leq x_i$ or $\min\dagger\{x_0, \ldots, x_i\} = 0$. Thus $$\min\dagger\{x_0, \ldots, x_i\} + x_j < 2\ln(2) \quad (EQ\ 28)$$

Thus, by the property 2 and the definition of min†, the following relationship also hold true.

$$\min\dagger(\min\dagger\{x_0, \ldots, x_i\}, x_j) = 0 \quad (EQ\ 29)$$

Figure 8:
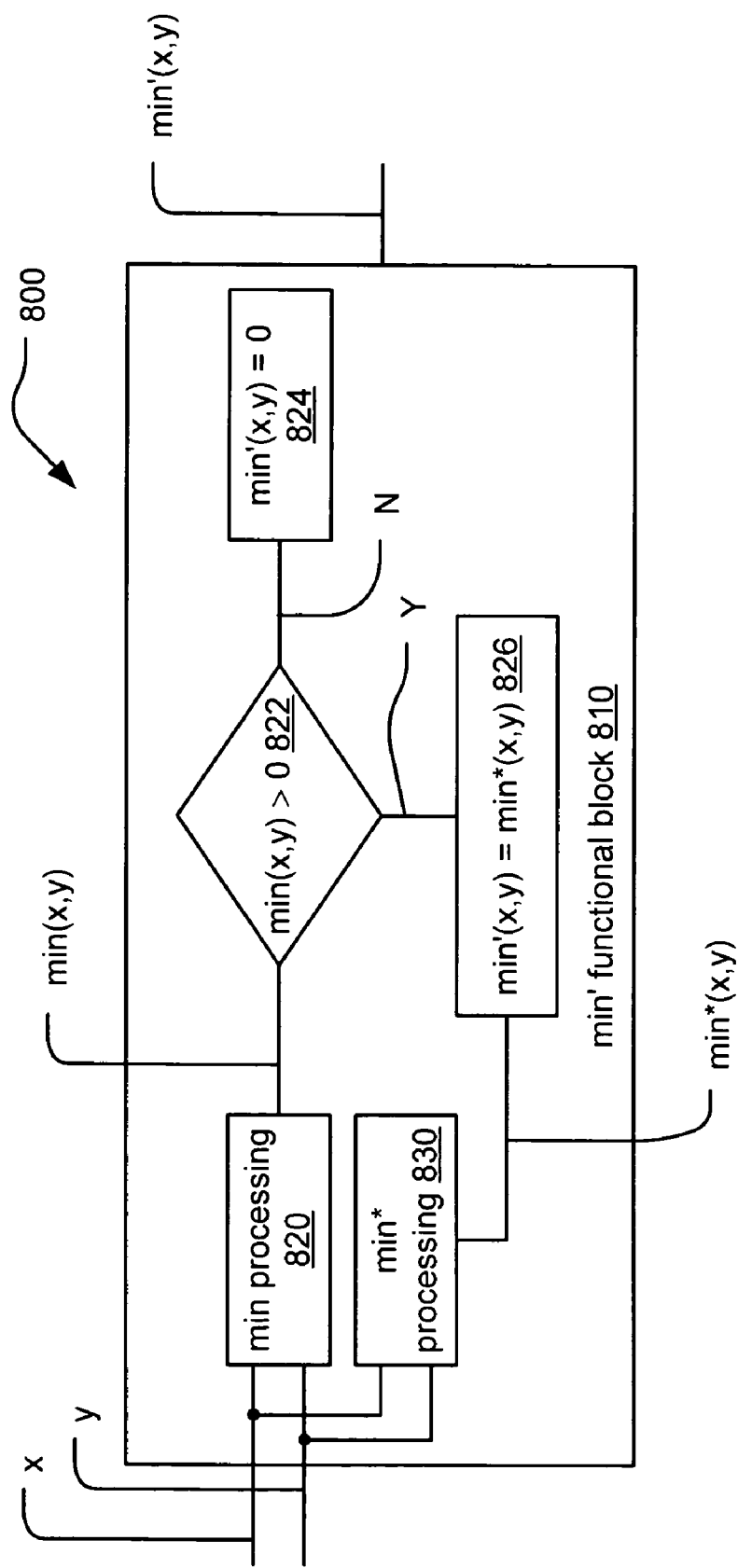
FIG. 8 is a diagram illustrating an embodiment of processing of a min' (min-prime) functional block in accordance with certain aspects of the invention.

Thus, by the property 3, we have $\min\dagger\{x_0, \ldots, x_{m-1}\} = \min\dagger\{x_0, x_{j+1}, \ldots, x_{m-1}\} = 0$ Above, the min† operator is introduced as being an approximation of the min** operator. In addition, another approximation processing approach is introduced for use in approximating the processing performed by the min* operation.

min' (Min-Prime) Operator:

FIG. 8 is a diagram illustrating an embodiment 800 of processing of a min' (min-prime) functional block 810 in accordance with certain aspects of the invention.

Below, another approximation processing approach is introduced. This min' operator (or min-prime operator) is introduced as being an approximation of the min* operator. The processing that is being performed by the min' operator may be referred to as min' processing. The min' operator is a modification of the min† operator.

$$\min'(x, y) = \begin{cases} \min^{*}(x, y) & \min^{*}(x, y) > 0 \\ 0 & \text{otherwise} \end{cases} \quad (EQ\ 30)$$

As can clearly be seen by the relationship provided above, when the portion of $\min\{x, y\} \leq 0$ there is no need to consider the correction part of $\ln(1+\exp(-|x-y|))$. Therefore, this operator may be viewed as being simpler than the min† operator. However, even when $\min\{x, y\} > 0$, then $\min^{*}(x, y)$ can be less than 0 when the correction part has a value greater than $\min\{x, y\}$. Thus, min' $(x, y)$ can also be less than 0.

In this diagram, two inputs, x and y, are provided to a min' functional block 810. These two inputs, x and y, undergo min* processing as shown in a min* processing functional block 830 as well as min processing as shown in a min processing functional block 820. When the result of the min processing functional block 820 is greater than zero within a degree of precision that may be defined by a designer as shown in a block 822, then the resultant of the min' processing is set to be the resultant of the min* processing functional block 830 as shown in a block 826. Alternatively, when the result of the min processing functional block 820 is not greater than zero within a degree of precision that may be defined by a designer, then the resultant of the min' processing is set to be zero as shown in a block 824.

It is noted that the min† processing or the min' processing may be employed in exchange of min processing in any of the previous embodiments when performing check node processing. It is asserted that either of the min† processing or min' processing is a very good approximation of min processing with relatively less complexity. This reduced complexity allows for easier implementation and less space consumption in hardware of an actual communication device that is implemented to perform these calculations.

Figure 9:
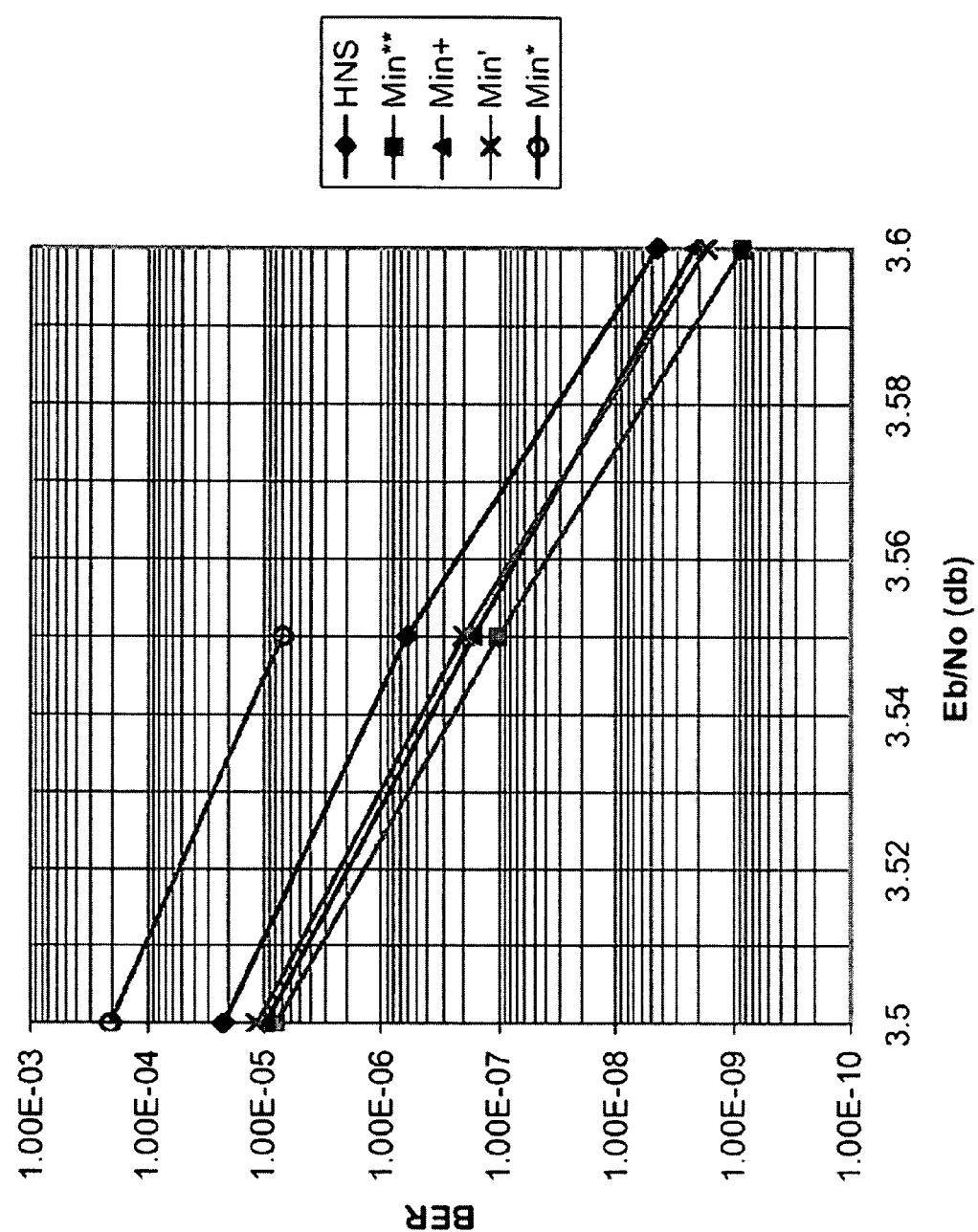
FIG. 9 is a diagram illustrating an embodiment of performance comparison of 5 processing approaches to code rate ⅔ 8 PSK (Phase Shift Key) LDPC (Low Density Parity Check) coded modulation that is proposed in the DVB-S2 draft standard.

FIG. 9 is a diagram illustrating an embodiment of performance comparison of 5 processing approaches to code rate ⅔ 8 PSK (Phase Shift Key) LDPC (Low Density Parity Check) coded modulation that is proposed in the DVB-S2 draft standard.

This performance diagram is described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

The following simulation is of a rate ⅔ 8 PSK (Phase Shift Key) LDPC (Low Density Parity Check) coded modulation that is being proposed DVBS2 with the 5 different approaches described herein. The 5 different approaches are listed as follows:

1. software provided by HNS for DVBS2
2. min** (min-double-star) processing approach
3. min† (min-dagger) processing approach
4. min' (min-prime) processing approach
5. min* (min-star) processing approach When considering a broad range of values for inputs, it can be seen that the min† operator and the min' operator are the best 2 approaches for approximating the results provided by the min** operator.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to decode an LDPC (Low Density Parity Check) coded signal, the decoder comprising:
    a bit node processor that is operable to:
        receive a plurality of bit metrics; and
        perform bit node processing that involves updating a plurality of edge messages with respect to a plurality of bit nodes; and
    a check node processor that is operable to perform check node processing that involves updating a plurality of edge messages with respect to a plurality of check nodes by performing min† (min-dagger) processing or min' (min-prime processing).

2. The decoder of claim 1, further comprising:
    a metric generator that is operable to:
        receive I, Q (In-phase, Quadrature) values corresponding to a symbol of the LDPC coded signal; and
        generate a plurality of symbol metrics from the I, Q values; and
    a symbol node calculator functional block that is operable to generate the plurality of bit metrics from the plurality of symbol metrics.

3. The decoder of claim 1, further comprising:
    a hard limiter that is operable to receive soft output from the bit node processor that corresponds to most recently updated plurality of edge messages with respect to the plurality of bit nodes and to make best estimates of bits of a symbol of the LDPC coded signal using the soft output.

4. The decoder of claim 3, further comprising:
    a syndrome calculation functional block that is operable to receive the best estimates of bits of the symbol of the LDPC coded signal from the hard limiter and is operable to determine whether each of a plurality of syndromes of an LDPC code by which the LDPC coded signal is generated is substantially equal to zero within a degree of precision.

5. The decoder of claim 1, wherein the check node processor further comprises a min† functional block that is operable to:
    perform min† processing on a plurality of inputs to generate a min† result;
    include a min* (min-star) functional block that is operable to perform min* processing on the plurality of inputs to generate a min* result;
    when the min* result is greater than or equal to zero within a predetermined degree of precision, the min† functional block is operable to output the min* result as the min† result; and
    when the min* result is less than zero within a predetermined degree of precision, the min† functional block is operable to output a value of zero as the min† result.

6. The decoder of claim 1, wherein the check node processor further comprises a min' functional block that is operable to:
    perform min' processing on a plurality of inputs thereby to generate a min' result;
    include a min functional block that is operable to perform min processing on the plurality of inputs to generate a min result;
    include a min* (min-star) functional block that is operable to perform min* processing on the plurality of inputs to generate a min* result;
    when the min result is greater than zero within a predetermined degree of precision, the min' functional block is operable to output the min* result as the min' result; and
    when the min result is less than or equal to zero within the predetermined degree of precision, the min' functional block is operable to output a value of zero as the min' result.

7. The decoder of claim 1, wherein:
    the LDPC coded signal is a variable code rate signal;
    the first symbol of the LDPC coded signal has a first code rate; and
    the second symbol of the LDPC coded signal has a second code rate.

8. The decoder of claim 1, wherein:
    the LDPC coded signal is a variable modulation signal;
    the first symbol of the LDPC coded signal has a first modulation having a first constellation shape and a corresponding first mapping; and
    the second symbol of the LDPC coded signal has a second modulation having a second constellation shape and a corresponding second mapping.

9. The decoder of claim 1, wherein:
    the decoder is operable to decode LDPC coded signals that are compliant with at least one of DVB-S2 (Digital Video Broadcasting Project—Satellite Version 2) draft standard and recommended practices provided by IEEE (Institute of Electrical & Electronics Engineers) P802.3an (10 GBASE-T) Task Force.

10. A method for decoding an LDPC (Low Density Parity Check) coded signal, the method comprising:
    receiving a plurality of bit metrics;

performing bit node processing that involves updating a plurality of edge messages with respect to a plurality of bit nodes; and performing check node processing that involves updating a plurality of edge messages with respect to a plurality of check nodes by performing min† (min-dagger) processing or min' (min-prime processing).

11. The method of claim 10, further comprising:

receiving I, Q (In-phase, Quadrature) values corresponding to a symbol of the LDPC coded signal;

generating a plurality of symbol metrics from the I, Q values; and generating the plurality of bit metrics from the plurality of symbol metrics.

12. The method of claim 10, further comprising:

receiving soft output that corresponds to most recently updated plurality of edge messages with respect to the plurality of bit nodes; and making best estimates of bits of a symbol of the LDPC coded signal using the soft output.

13. The method of claim 12, further comprising:

receiving best estimates of bits of the symbol of the LDPC coded signal; and determining whether each of a plurality of syndromes of an LDPC code by which the LDPC coded signal is generated is substantially equal to zero within a degree of precision.

14. The method of claim 10, further comprising:

performing min† processing on a plurality of inputs to generate a min† result there from;

performing min* processing on the plurality of inputs to generate a min* result there from;

when the min* result is greater than or equal to zero within a predetermined degree of precision, outputting the min* result as the min† result; and when the min* result is less than zero within a predetermined degree of precision, outputting a value of zero as the min† result.

15. The method of claim 10, further comprising:

performing min' processing on a plurality of inputs thereby generating a min' result there from;

performing min processing on the plurality of inputs thereby generating a min result there from;

performing min* processing on the plurality of inputs thereby generating a min* result there from;

when the min result is greater than zero within a predetermined degree of precision, outputting the min* result as the min' result; and when the min result is less than or equal to zero within the predetermined degree of precision, outputting a value of zero as the min' result.

16. The method of claim 10, wherein:

the LDPC coded signal is a variable code rate signal;

the first symbol of the LDPC coded signal has a first code rate; and the second symbol of the LDPC coded signal has a second code rate.

17. The method of claim 10, wherein:

the LDPC coded signal is a variable modulation signal;

the first symbol of the LDPC coded signal has a first modulation having a first constellation shape and a corresponding first mapping; and the second symbol of the LDPC coded signal has a second modulation having a second constellation shape and a corresponding second mapping.

18. The method of claim 10, wherein:

the method is operable to decode LDPC coded signals that are compliant with at least one of DVB-S2 (Digital Video Broadcasting Project—Satellite Version 2) draft standard and recommended practices provided by IEEE (Institute of Electrical & Electronics Engineers) P802.3an (10 GBASE-T) Task Force.

19. A decoder that is operable to decode an LDPC (Low Density Parity Check) coded signal, the decoder comprising:

a bit node processor that is operable to:

receive a plurality of bit metrics; and perform bit node processing that involves updating a plurality of edge messages with respect to a plurality of bit nodes; and a check node processor that is operable to perform check node processing that involves updating a plurality of edge messages with respect to a plurality of check nodes by performing min† (min-dagger) processing or min' (min-prime processing); and wherein:

the LDPC coded signal is a variable code rate signal; and the LDPC coded signal is a variable modulation signal.

20. A method for decoding an LDPC (Low Density Parity Check) coded signal, the method comprising:

receiving a plurality of bit metrics;

performing bit node processing that involves updating a plurality of edge messages with respect to a plurality of bit nodes; and performing check node processing that involves updating a plurality of edge messages with respect to a plurality of check nodes by performing min† (min-dagger) processing or min' (min-prime processing); and wherein:

the LDPC coded signal is a variable code rate signal; and the LDPC coded signal is a variable modulation signal.

* * * * *